United States Patent
Ozeki

(10) Patent No.: US 7,903,482 B2
(45) Date of Patent: Mar. 8, 2011

(54) SEMICONDUCTOR STORAGE DEVICE AND MEMORY CELL TEST METHOD

(75) Inventor: Seiji Ozeki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 113 days.

(21) Appl. No.: 12/244,926

(22) Filed: Oct. 3, 2008

(65) Prior Publication Data
US 2009/0091993 A1 Apr. 9, 2009

(30) Foreign Application Priority Data
Oct. 3, 2007 (JP) ................................. 2007-259982

(51) Int. Cl.
*G11C 29/00* (2006.01)
(52) U.S. Cl. .................... 365/200; 365/201; 365/185.09; 365/230.06
(58) Field of Classification Search .................. 365/200, 365/201, 230.06, 185.09
See application file for complete search history.

(56) References Cited

U.S. PATENT DOCUMENTS

| | | | | |
|---|---|---|---|---|
| 5,325,334 A * | 6/1994 | Roh et al. | | 365/201 |
| 5,485,424 A * | 1/1996 | Kawamura | | 365/200 |
| 5,561,627 A * | 10/1996 | Matsubara et al. | | 365/185.04 |
| 5,787,043 A * | 7/1998 | Akioka et al. | | 365/200 |
| 5,856,951 A * | 1/1999 | Arimoto et al. | | 365/226 |
| 5,862,086 A * | 1/1999 | Makimura et al. | | 365/200 |
| 6,028,815 A * | 2/2000 | Schoniger et al. | | 365/230.06 |
| 6,038,191 A * | 3/2000 | Fukuhara et al. | | 365/229 |
| 6,115,286 A * | 9/2000 | Zettler | | 365/185.09 |
| 6,134,159 A * | 10/2000 | Sekino | | 365/200 |
| 6,208,569 B1 * | 3/2001 | Patel et al. | | 365/200 |
| 6,233,181 B1 * | 5/2001 | Hidaka | | 365/200 |
| 6,697,289 B1 * | 2/2004 | Yamamoto | | 365/200 |
| 7,379,359 B2 * | 5/2008 | Sakakibara | | 365/200 |

FOREIGN PATENT DOCUMENTS

JP    2006-107664    4/2006

* cited by examiner

*Primary Examiner* — Viet Q Nguyen
(74) *Attorney, Agent, or Firm* — Young & Thompson

(57) ABSTRACT

A semiconductor storage device includes: a memory section including memory cell groups; a redundancy circuit which stops to access the memory section when the redundancy circuit section is activated, and to activate one of the redundancy memory cell groups corresponding to an address signal when the redundancy circuit section is activated; a redundancy decoder which accesses one of the redundancy memory cell groups corresponding to an input selection signal; and a decoder which accesses one of the memory cell groups corresponding to an input address signal, and stops to access the memory cell groups in response to a selection signal. In a normal mode, an access to the redundancy memory section is permitted. In a redundancy circuit inactivation mode, an access to the redundancy memory section is prohibited. Memory tests of a storage device under various conditions can be performed in a short time.

4 Claims, 22 Drawing Sheets

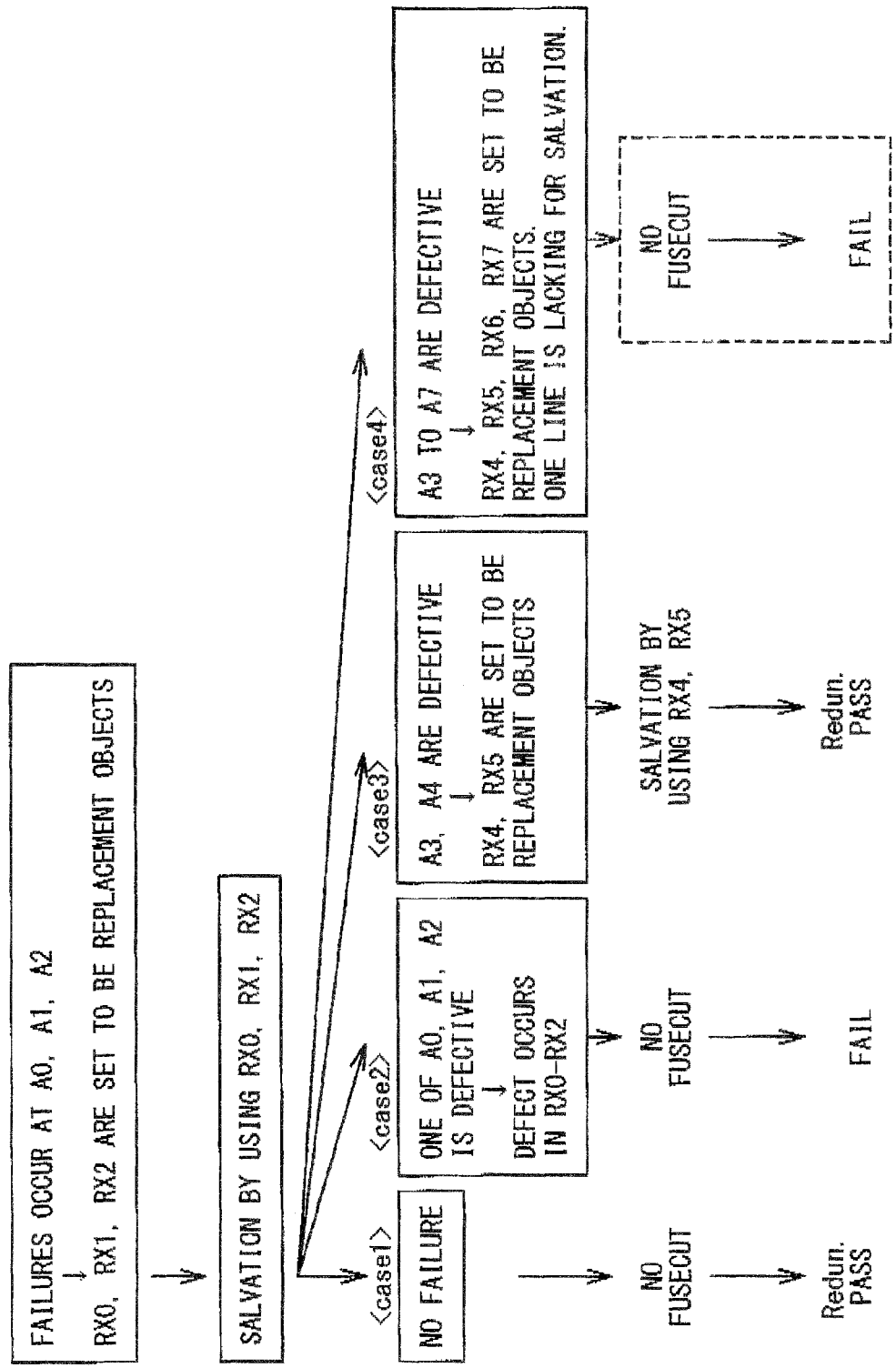

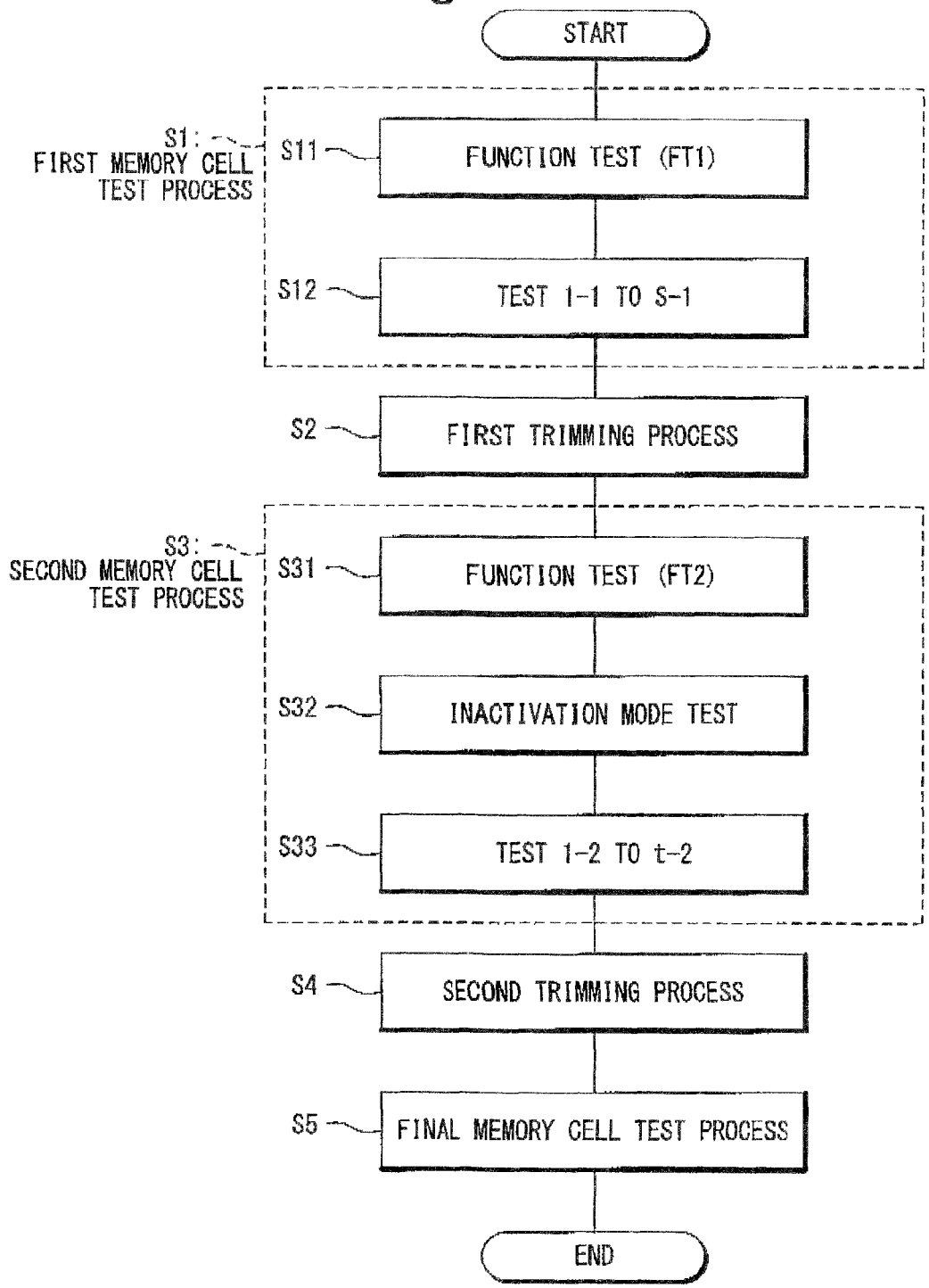

Fig. 16A  BEFORE FIRST MEMORY CELL TEST PROCESS

Fig. 16B  AFTER FIRST MEMORY CELL TEST PROCESS

Fig. 16C  AFTER FIRST TRIMMING PROCESS

MEMORY SPACE ADDRESS : A0 A1 A2 A3 A4 ... An

TARGET WORD LINE : X0 X1 X2 X3 X4 ... Xn (RX0RX1RX2 X3 X4 ... Xn in Fig. 16C)

Fig. 17A  Fig. 17B  Fig. 17C

FUNCTION TEST (FT2)

MEMORY SPACE ADDRESS : A0 A1 A2 A3 A4 ... An
TARGET WORD LINE : RX0 RX1 RX2 X3 X4 ... Xn

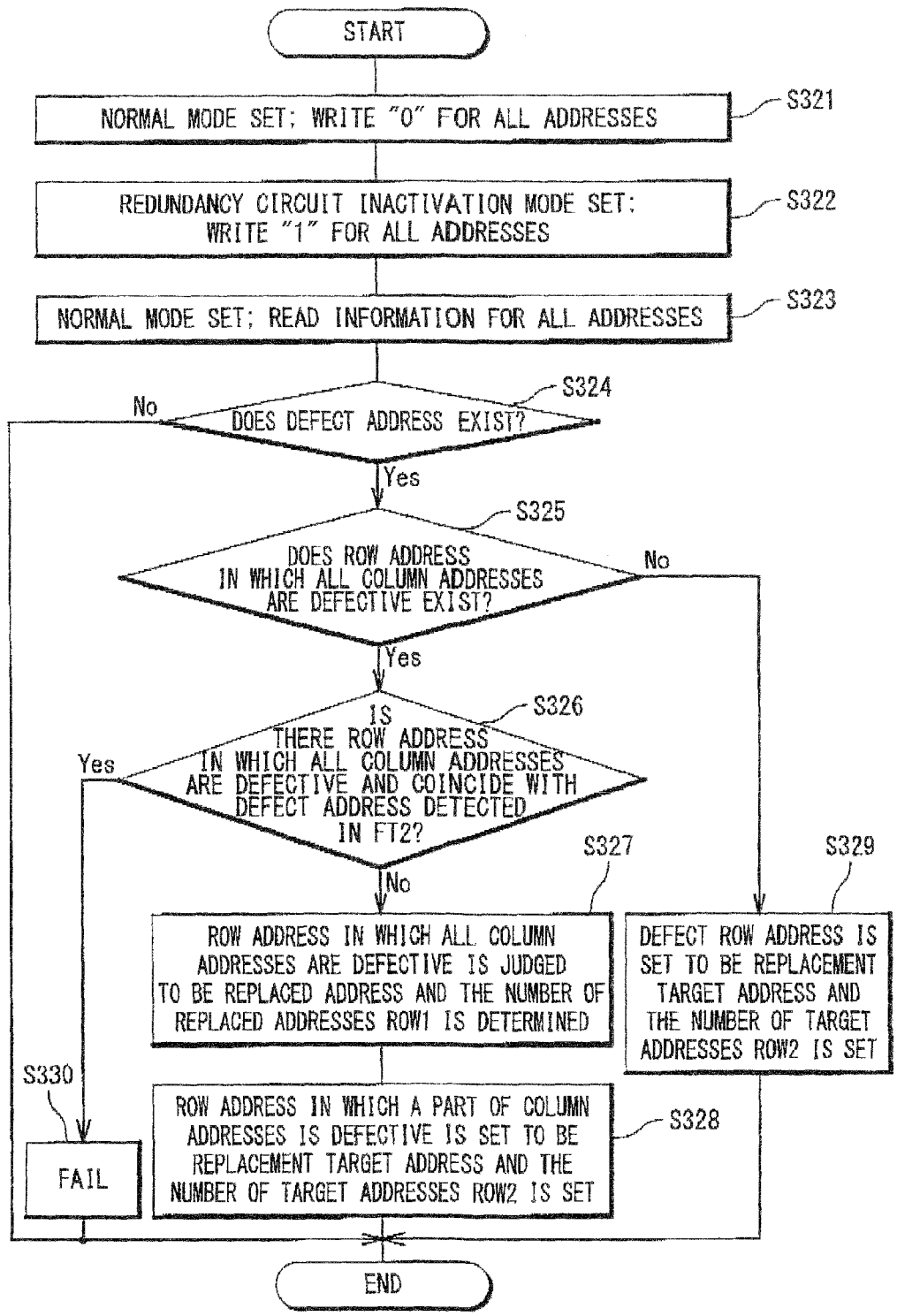

Fig. 19A

NORMAL MODE: WRITE "0"

| MEMORY SPACE ADDRESS : | A0 | A1 | A2 | A3 | A4 | ... | An |
|---|---|---|---|---|---|---|---|
| | 0 | 0 | 0 | 0 | 0 | ... | 0 |
| | 0 | 0 | 0 | 0 | 0 | ... | 0 |
| | 0 | x | 0 | 0 | 0 | ... | 0 |
| | 0 | 0 | 0 | 0 | 0 | ... | 0 |
| ... | ... | ... | ... | ... | ... | ... | ... |
| | 0 | 0 | 0 | 0 | 0 | ... | 0 |
| | 0 | 0 | 0 | 0 | 0 | ... | 0 |
| | 0 | 0 | 0 | 0 | 0 | ... | 0 |
| TARGET WORD LINE : | RX0 | RX1 | RX2 | X3 | X4 | ... | Xn |

Fig. 19B

INACTIVATION MODE TEST

INACTIVATION MODE: WRITE "1"

| A0 | A1 | A2 | A3 | A4 | ... | An |
|---|---|---|---|---|---|---|
| 1 | 1 | 1 | 1 | 1 | ... | 1 |
| 1 | 1 | 1 | 1 | 1 | ... | 1 |
| 1 | x | 1 | 1 | 1 | ... | 1 |
| 1 | 1 | 1 | 1 | 1 | ... | 1 |
| ... | ... | ... | ... | ... | ... | ... |
| 1 | 1 | 1 | 1 | 1 | ... | 1 |
| 1 | 1 | 1 | 1 | 1 | ... | 1 |
| 1 | 1 | 1 | 1 | 1 | ... | 1 |
| X0 | X1 | X2 | X3 | X4 | ... | Xn |

Fig. 19C

NORMAL MODE: READ

| A0 | A1 | A2 | A3 | A4 | ... | An |
|---|---|---|---|---|---|---|
| 0 | 0 | 0 | 0 | 0 | ... | 0 |
| 0 | 0 | 0 | 0 | 0 | ... | 0 |
| 0 | x | 1 | 1 | 1 | ... | 1 |
| 0 | 0 | 0 | 0 | 1 | ... | 1 |
| ... | ... | ... | ... | ... | ... | ... |
| 0 | 0 | 0 | 0 | 1 | ... | 1 |
| 0 | 0 | 0 | 0 | 1 | ... | 1 |
| 0 | 0 | 0 | 0 | 1 | ... | 1 |
| RX0 | RX1 | RX2 | X3 | X4 | ... | Xn |

Fig. 20A

AFTER SECOND MEMORY CELL TEST PROCESS

MEMORY SPACE ADDRESS : A0 A1 A2 A3 A4 A5 A6 A7 ... An

TARGET WORD LINE : RX0 RX1 RX2 X3 X4 X5 X6 X7 ... Xn

Fig. 20B

AFTER SECOND TRIMMING PROCESS

A0 A1 A2 A3 A4 A5 A6 A7 ... An

RX0 RX1 RX2 RX3 RX4 RX5 RX6 RX7 ...

SEMICONDUCTOR STORAGE DEVICE AND MEMORY CELL TEST METHOD

INCORPORATION BY REFERENCE

This Patent Application is based on Japanese Patent Application No. 2007-259982. The disclosure of the Japanese Patent Application is incorporated herein by reference.

BACKGROUND OF THE INVENTION

1. Field of the Invention

The present invention relates to a semiconductor storage device and a memory cell test method, in particular, a semiconductor storage device to which a plurality of memory test processes are performed under different conditions and a test method thereof.

2. Description of Related Art

Generally, in manufacturing a semiconductor storage device, primary memory cells and redundancy memory cells are manufactured. The redundancy memory cell serves as an auxiliary element when a primary memory cell does not operate. When the primary memory cell is not defective, they are used as a memory cell in the storage device. In a case that a primary memory cell is detected to be defective, the connection of the memory cell with the surrounding circuits is replaced with the connection of a redundancy memory cell with the same surrounding circuits, thereby the defective memory cell is salvaged.

The redundancy memory cell is provided in a device as a unit of a word line or a digit select line (bit line), for example. Such a semiconductor storage device has a memory section including a (primary) memory cell usually contributes to the storage capacity and redundancy memory cells for salvaging defective cells, defective word lines or defective digit select lines which may exist in the memory section. The redundancy memory cells include a redundancy row memory cell for a word line and a redundancy column memory cell for a digit select line and are arranged disposed near the memory section or in the memory section.

FIG. 1 is a block diagram showing a configuration of a semiconductor storage device according to a first reference example for explaining the present invention. The semiconductor storage device 300 according to the first reference example has a memory section 1, a redundancy row memory section 2, a redundancy column memory section 3, a redundancy row and column memory section 4, a row decoder group 311, a row predecoder group 312, a row redundancy circuit section 313, a row buffer circuit 314, a row redundancy decoder group 315, a column decoder group 321, a column predecoder group 322, a column redundancy circuit section 323, a column buffer circuit 324 and a column redundancy decoder group 325.

The memory section 1 has a plurality of memory cells C00 to Cnm which are provided in intersection regions between word lines X0 to Xn and digit select lines Y0 to Ym. The redundancy row memory section 2 has a plurality of redundancy row memory cells RXC00 to RXCpm which are provided in intersection regions between redundancy word lines RX0 to RXp and the digit select lines Y0 to Ym. The redundancy column memory section 3 has a plurality of redundancy column memory cells RYC00 to RYCnq which are provided in intersection regions between the word lines X0 to Xn and redundancy digit select lines RY0 to RYq. The redundancy row and column memory section 4 has a plurality of redundancy row and column memory cells RXYC00 to RXYCpq which are provided in intersection regions between the redundancy word lines RX0 to RXp and the redundancy digit select lines RY0 to RYq.

The row decoder group 311 is activated in accordance with a selection signal outputted from the row predecoder group 312, selects one of the word lines X0 to Xn and activates the selected word line. The column decoder group 321 is activated in accordance with a selection signal outputted from the column predecoder group 322 and selects one of the digit select lines Y0 to Ym. The row redundancy decoder group 315 is activated in accordance with a selection signal outputted from the row redundancy circuit section via the row buffer circuit 314 and selects one of the redundancy word lines RX0 to RXp. The column redundancy decoder group 325 is activated in accordance with a selection signal outputted from the column redundancy circuit section via the column buffer circuit 324 and selects one of the redundancy digit select lines RY0 to RYq.

The row redundancy circuit section 313 selects one of the row decoder group 311 and the row redundancy decoder group 315 as a decoder for selecting a word line based on a fuse circuit which is built therein and a row address signal 101. When the row decoder group 311 is selected and used, the row redundancy circuit section 313 outputs a signal for using the row decoder group 311 to the row predecoder group 312 as well as outputs a signal for inactivating the row redundancy decoder group 315 to the row buffer circuit 314. In this case, the row predecoder group 312 outputs a selection signal corresponding to the inputted row address signal 101. On the other hand, when the row redundancy decoder group 315 is selected and used, the row redundancy circuit section 313 outputs a selection signal to the row redundancy decoder group 315 as well as outputs a signal for inactivating the row predecoder group 312. In this case, the row redundancy decoder group 315 selects one of the redundancy word lines RX0 to RXp in accordance with a selection signal inputted via the row buffer circuit 314.

The row redundancy circuit section 313 has a plurality of row redundancy circuits shown in FIG. 2. Each row redundancy circuit includes an enable fuse circuit 30 and address fuse circuits F0 to F10, to which an INT signal 107 is inputted, an NMOS transistor 31 connected to the enable fuse circuit 30 at its gate, NMOS transistors Mn0 to Mn10 connected to the address fuse circuits F0 to F10, respectively, at their gates, PMOS transistors 32, 33 connected to a first power source VDD of a high-potential side at their sources and respectively connected to nodes N1, N2 at their drains, NMOS transistors 34, 35 connected to a second power source VSS of a low-potential side at their sources and connected to a node N5 at their gates, a NAND gate 37 for outputting NAND of input signals from the node N1 and the node N2 as a selection signal XREDB, and PMOS transistors 36 respectively connected to the node N1 and the node N2 at their drains and receive an input of the selection signal XREDB at their gates.

When a signal of an "L" level is inputted to at least either the node N1 or N2, the NAND gate 37 outputs the selection signal XREDB of the "H" level to the row redundancy decoder group 315. When a signal of the "H" level is inputted to both of the nodes N1 and N2, the NAND gate 37 outputs the selection signal XREDB of the "L" level to the row redundancy decoder group 315.

When both of the nodes N1, N2 are at the "H" level, it is determined that the selection signal XREDB is at the "L" level and the row redundancy memory cell is used. This state is referred to as an activated state of the row redundancy circuit. When one of the nodes N1, N2 is at the "L" level, it is determined that the selection signal XREDB is at the "H"

level and the row redundancy memory cell is not used. This state is referred to as an inactivated state of the row redundancy circuit.

The signal level at the node N1 is determined by driving condition of the NMOS transistors 31 and Mn0 to Mn4. Furthermore, the signal level of the node N2 is determined by driving condition of the NMOS transistors Mn5 to 10. The driving condition of the NMOS transistor 31 is determined by connection/disconnection state of a fuse in the enable fuse circuit 30. The driving condition of each of the NMOS transistors Mn0 to Mn10 is determined by connection/disconnection state of the corresponding fuse in the address fuse circuits F0 to F10 and row address signals XA00 to XA10.

The column redundancy circuit section 323 selects either the column decoder group 321 or the column redundancy decoder group 325 as a decoder for selecting a digit select line on the basis of fuse circuits built therein and a column address signal 201. When the column decoder group 321 is selected and used, the column redundancy circuit section 323 outputs a signal for using the column decoder group 321 to the column predecoder group 322 as well as outputs a signal for inactivating the column redundancy decoder group 325 to the column buffer circuit 324. In this case, the column predecoder group 322 outputs a selection signal corresponding to the inputted column address signal 201 to the column decoder group 321. On the other hand, when the column redundancy decoder group 325 is selected and used, the column redundancy circuit section 323 outputs a selection signal to the column redundancy decoder group 325 as well as outputs a signal for inactivating the column predecoder group 322. In this case, the column redundancy decoder group 325 selects one of the redundancy digit select lines RY0 to RYq in accordance with a selection signal inputted via the column buffer circuit 324.

The column redundancy circuit section 323 has a plurality of column redundancy circuits having a similar configuration to the above-mentioned row redundancy circuits. Each column redundancy circuit outputs a selection signal corresponding to the connection/disconnection state of a built-in fuse and an input column address signal 201 to the column redundancy decoder group 325. An operation of the redundancy circuit will be described below referring to the row redundancy circuit.

In FIG. 2, when the ACT signal 106 is at the "L" level, the PMOS transistors 32, 33 change the nodes N1, N2 to the "H" level and the NMOS transistors 34, 35 keeps the nodes N3, N4 at the "H" level. During this time, the nodes N1 to N4 are precharged.

When the ACT signal becomes the "H" level, precharge of the nodes N1 to N4 is released and the NMOS transistors 34, 35 are changed to conducting state. Here, when the output of the enable fuse circuit 30 is the "H" level, the node N1 is at the "L" level irrespectively of combination of the address signals XA00 to XA10, and the row redundancy circuits become inactivated. When the output of the enable fuse circuit 30 is the "L" level, the level of each of the nodes N1, N2 is determined by combination of the address signals XA00 to XA10, thereby activation/inactivation of the row redundancy circuits is determined. When the outputs of the address fuse circuits F0 to F10 are all "L" level in accordance with combination of the address signals XA00 to XA10 for activating the row redundancy circuits, the nodes N1, N2 are kept at the "H" level. Thereby, the selection signal XREDB becomes the "L" level and a row redundancy word line (row redundancy memory cell) is selected.

The enable fuse circuit 30 is implemented by a FUSE circuit 60 shown in FIG. 3. The FUSE circuit 60 has a PMOS transistor 50, a fuse 51, NMOS transistors 52, 53 and inverters 54, 55. The PMOS transistor 50 and the NMOS transistor 52 form an inverter having INT signal 107 as an input and the node N7 as an output. The fuse 51 is connected between the drain of the PMOS transistor 50 and the node N7. The node 7 is connected to an output terminal OUT1 via the inverters 54, 55. The output terminal OUT1 of the enable fuse circuit 30 is connected to the gate of the NMOS transistor 31 shown in FIG. 2. The gate of the NMOS transistor 53 is connected to the output of the inverter 54 and the drain thereof is connected to the node N7. The NMOS transistor 53 fixes the output level of the inverter 54.

Here, the INT signal 107 is a one-shot pulse signal which is at the "H" level only at a period just after turned-on and then, becomes the "L" level. The INT signal 107 may be inputted from an outside signal or may be generated in the semiconductor storage device 300 shown in FIG. 1.

When the fuse 51 is fused, namely, the fuse 51 is blown to disconnect the electrical connection, the signal level at the output terminal OUT1 becomes "L" in accordance with the one-shot INT signal 107 of the "H" level. In this case, the NMOS transistor 31 is turned off and the signal level at the node N1 is determined by the NMOS transistors Mn0 to Mn4. On the other hand, when the fuse 51 is not fused, the PMOS transistor 50 and the NMOS transistor 52 operate as an inverter and the signal level of the output terminal OUT1 becomes the "H" in accordance with the INT signal 107 of the "L" level after the one-shot pulse. In this case, the signal level at the node N1 is lowered by the NMOS transistor 31 and becomes the "L" level. That is, in a trimming process, the fuse 51 is fused for setting the row redundancy circuit 130 to the activated state and is not fused for setting it to the inactivated state.

Referring to FIG. 2, the NMOS transistors Mn0 to Mn10 determine the signal level of each of the nodes N1 and N2 in accordance with the signal levels inputted from the address fuse circuits F0 to F10, respectively. The address fuse circuits F0 to F10 determine the signal levels inputted to gates of the NMOS transistors Mn0 to 10 in accordance with the signal levels of the INT signal 107 and the row address signals XA00 to XA10 and the connection/disconnection state of the FUSE circuit 60 built therein.

Each of the address fuse circuits F0 to F10 is implemented by the FUSE circuit 70 shown in FIG. 4. FIG. 4 is a circuit diagram showing a configuration of the address fuse circuit F0. Configurations of the address fuse circuits F1 to F10 are the same as that of the address fuse circuit F0. The FUSE circuit 70 has a FUSE circuit 60 connected between a terminal to which the INT signal 107 is inputted and the node N8, a transfer gate 62 which is controlled by a complementary signal from the node N8 and outputs a signal corresponding to the row address signal XA00 to the output terminal OUT2 (the gate of the NMOS transistor Mn0) and a transfer gate 63 which is controlled by a complementary signal from the node N8 and outputs a signal corresponding to an inversion signal of the row address signal XA00 to the output terminal OUT2. Here, the output terminal OUT1 of the FUSE circuit 60 is connected to the node N8. As described above, the INT signal 107 is outputted as a one-shot pulse signal of the "H" level only at turn-on period and then, becomes the "L" level.

When the fuse 51 of the FUSE circuit 60 provided in the FUSE circuit 70 is fused, the signal level of the output terminal OUT2 becomes a signal level obtained by inverting the row address signal XA00. On the other hand, when the fuse 51 is not is not fused, the signal level of the output terminal OUT2 becomes a same signal level as that of the row address signal XA00.

For example, for setting the row redundancy circuit to the activated state under the condition that the row address signal XA00 is at the "H" level, the fuse 51 of the address fuse circuit F0 is fused. In this case, in accordance with the row address signal XA00 of the "H" level, the gate of the NMOS transistor Mn0 becomes the "L" level and the node N1 transitions to the "H" level. Conversely, in accordance with the row address signal XA00 of the "L" level, the gate of the NMOS transistor Mn0 becomes the "H" level and the node N1 transitions to the "L" level.

On the other hand, for setting the row redundancy circuit to the activated state under the condition that the address signal XA00 is at the "L" level, the fuse 51 of the address fuse circuit F0 is not fused. Correspondence between combination of the signal levels of the address signals XA00 to XA10 for bringing a row redundancy circuit into the activated state and the connection/disconnection state of the fuse 51 can be appropriately set for each row redundancy circuit and each address fuse circuit.

Regardless of the connection/disconnection states of the address fuse circuits F0 to F10, it is possible to activate the row redundancy circuit 130 with some sort of address information. For refusing the use of the row redundancy circuit 130, since it is required to achieve the inactivated state independently of the address information, the enable fuse circuit 30 is required.

As described above, whether the row redundancy circuit is used or not is determined by the enable fuse circuit 30 and when the row redundancy circuit is used, activation/inactivation is determined depending on the address fuse circuits F0 to F10 and the row address signals XA00 to XA10. The selection signal XREDB outputted from the activated row redundancy circuit drives a row redundancy decoder and activates a redundancy word line.

In this reference example, after the semiconductor storage device 300 with the aforementioned configuration is formed on a wafer, a memory test is carried out. In a memory test, existence/absence of defects in the memory section 1 is detected. A defective cell, a defective word line or a defective digit select line which is detected in the memory test is salvaged by being replaced with the redundancy memory section (the redundancy row memory section 2, the redundancy column memory section 3 or the redundancy row and column memory section 4), which is called trimming process.

Describing the trimming process in detail, when a plurality of tests are carried out in a memory cell test process and a defect spot is detected, fuse information is generated to salvage a defect address corresponding the defect spot. Next, in the trimming process, based on the fuse information, fuse circuits of the row redundancy circuit section 313 and the column redundancy circuit section 323 are fused. At this time, the fuse circuits are fused so as to select a replaced redundancy memory cell in accordance with an address signal for selecting the defect spot in the memory section 1. For example, the fuse circuit in the row redundancy circuit section 313 is fused so as to select (to activate) any one of the redundancy word lines RX0 to RXp in place of the defect spot on the word lines X0 to Xn. The fuse circuit in the column redundancy circuit section 323 is fused so as to select (to activate) any one of the redundancy digit select lines RY0 to RYq in place of the defect spot on the digit select lines Y0 to Ym. Thereby, the memory cell corresponding to the defect address is replaced with the redundancy memory cell. As long as there is no defect in the redundancy memory cell which is used for replacing the defective memory cell by trimming, the semiconductor storage device becomes a non-defective product under the conditions of the memory test.

SUMMARY

Generally, as shown in FIG. 5, memory cell test process is performed more than one time (in FIG. 5, two times) under various conditions and trimming is performed for each memory cell test process. A defect spot detected in a first memory cell test process is salvaged in a first trimming process performed after the first memory cell test process. Following the first trimming process, a second memory cell test process is performed under a condition which is different from that in the first memory cell test process. The defect spot detected in the second memory cell test process is salvaged in a second trimming process performed after the second memory cell test process.

Referring to FIG. 1, when the word lines X0, X1, X2 are detected as defective word lines in the first memory cell test process, it is assumed that the word lines X0, X1, X2 are replaced with the redundancy word lines RX0, RX1, RX2, respectively, in the first trimming process. After that, when the word lines X3, X4 are newly detected as the defective word lines in the second memory cell test process, it is necessary to select the redundancy word lines to replace the defective word lines from the redundancy word lines RX3 to RXp other than the redundancy word lines RX0, RX1, RX2 in the second trimming process. That is, if the fuse circuit in the row redundancy circuit section is fused so as to select two redundancy word lines from the redundancy word lines RX3 to RXp in accordance with the row address signal 101 for selecting the word lines X3, X4, a non-defective product is expected to be produced.

In a case where the redundancy circuits as shown in FIG. 2 are used, however, a device (semiconductor storage device) cannot recognize which redundancy memory cell is used for replacement (for which redundancy circuit is used) in the first trimming process. That is, if tests are performed in the second memory cell test process as in the first memory cell test process, the device cannot determine whether the redundancy word lines RX0 to RX2 are used or not. At this time, in the case where a plurality of tests are performed and defect spots are detected in the second memory cell test process under the supposition that all of the redundancy word lines RX0 to RXp are not used, there is undesirable possibility that the defective word lines are replaced with the redundancy word lines RX0 to RX2 in the second trimming process. In the case where the redundancy memory cell selected as a replacement object used for the replacement of the memory cell having a defect spot detected in the second trimming process is the redundancy memory cell used for the replacement in the first trimming process, the replacement of the row redundancy memory cell means multi-selection by a plurality of addresses, causing an operational failure.

For preventing the multi-selection, it is possible to adopt a test method which is referred to as a second reference example below. In this method, the number of available redundancy memory cells (or, more generally, available redundancy circuits) for each of the first memory cell test process and the second memory cell test process is previously set in a test program.

Referring to FIGS. 6A and 6B, an operation of a memory cell test according to the second reference example will be described in detail. In the case shown in FIGS. 6A and 6B, there are eight redundancy word lines (8 ROWs). The number of available redundancy word lines is set four in the first memory cell test process (the redundancy word lines RX0 to RX3) and also four in the second memory cell test process (the redundancy word lines RX4 to RX7). Here, the addresses corresponding to the word lines X0 to X7 are represented by addresses A0 to A7. It is assumed that a defect address is salvaged by a redundancy word line. When a defect spots are detected at the addresses A0, A1, A2 (the word lines X0, X1, X2) in the first memory cell test process, the defects can be salvaged by using three of the four redundancy word lines RX0 to RX3. Here, it is assumed that the redundancy word lines RX0 to RX2 are used.

Under such conditions, it is inspected whether the defective memory cell can be salvaged or not based on the spot and the frequency of its occurrence in the second trimming process.

Case 1: when no defect spot is detected in the second memory cell test process, any fuse is not cut in the second trimming process and the device is determined to be non-defective (in such a case, it is judged that the result of the test is "PASS," namely, it is judged that the product is not defective based on passing all tests) (to be exact, it is expected to be determined as a non-defective device).

Case 2: when a defect spot is detected at any one of the addresses A0, A1, A2 in the second memory cell test process, the device is determined to be defective (in this case, the result is "FAIL"). In this case, it is determined that a defective spot exists in the redundancy word lines RX0 to RX2 which are used for the replacement of defective word lines in the first trimming process in the second memory cell test process.

Case 3: in this case, addresses other than defect addresses detected in the first memory cell test process are determined as defect addresses in the second memory cell test process. Further, the number of the newly detected defect addresses is equal to or less than the number of redundancy word lines available in the second memory cell test process (here, four). In this case, the defect spot is salvaged by using the redundancy word lines selected from the available redundancy word lines and the device is determined to be non-defective (PASS). For example, when defect spots are detected at the addresses A3, A4 (the word lines X3, X4), the redundancy word lines RX3, RX4 are selected for replacement. In the second trimming process, the fuse circuits are cut so that the redundancy word lines RX3, RX4 are selected in place of the defective word lines X3, X4. After the second trimming process, the device is determined to be non-defective (PASS) (to be exact, it is expected to be determined as a non-defective device).

Case 4: in this case, addresses other than defect addresses detected in the first memory cell test process are determined as defect addresses. Further, the number of the newly detected defect, addresses is larger than the number of available redundancy word lines (here, four) in the second memory cell test process. In this case, the device is determined to be defective since the number of the redundancy word lines which can be used for the replacement of the defective word lines lacks. For example, when defect spots are detected at the five addresses A3 to A7 other than the addresses A0 to A2 (the five word lines X3, X4, X5, X6, X7) in the second memory cell test process, since the number of available redundancy word lines (the redundancy word lines RX4 to RX7) is four, all of the defect spots cannot be salvaged. In this case, the device is determined to be defective (FAIL).

In the case 4, the number of the defective word lines detected in the first memory cell test process and the second memory cell test process is eight in total and the eight redundancy word lines (8 ROW) mounted in the device is considered to be sufficient. However, in this reference example, since the number of available redundancy word lines for each process is previously set in a test program, the redundancy word lines which are not used in the first memory cell test process cannot be effectively utilized. Therefore, to salvage the defect spots in the second and the following memory cell test processes, it is desired to monitor the number of redundancy memory cell (redundancy word line or/and redundancy digit select line) which can be used for replacement for each device in the second and the following trimming processes.

For example, in a technique described in Japanese Laid-Open Patent Application JP-P2006-107664A (which is referred to as Patent Document 1), the address of replacing redundancy memory cell is grasped, and in subsequent trimming process, redundancy circuits corresponding to their addresses are excluded by a test program. A semiconductor storage device described in the Patent Document 1 has a logic circuit for blocking program information on an enable fuse (a fuse for determining used/unused of the redundancy circuit). The logic circuit can disable the enable fuse and check a program state of an address fuse. Here, when no address fuse is fused, to know used/unused of the redundancy circuit and address information at this time, use/unused of the enable fuse needs to be further examined. For this reason, in the Patent Document 1, program information of the address fuse and program information of the enable fuse must be separately identified. That is, according to the technique disclosed in the Patent Document 1, to check the used redundancy circuit, a plurality of tests (roll call test mode and check of the enable fuse) must be performed.

As described above, according to the technique disclosed in the Patent Document 1, to check the unused redundancy circuit (redundancy memory cell) in trimming, a plurality of roll call tests must be performed. Thus, the memory cell test performed after trimming becomes complicated and takes long time.

In a first aspect of the present invention, a semiconductor storage device includes: a memory section including a plurality of memory cell groups; a redundancy memory section including a plurality of redundancy memory cell groups; a redundancy circuit section configured to stop an access to the memory section when the redundancy circuit section is activated, and to activate one of the plurality of redundancy memory cell groups corresponding to an address signal when the redundancy circuit section is activated and receives the address signal; a redundancy decoder configured to access one of the plurality of redundancy memory cell groups corresponding to a selection signal in response to the selection signal outputted from the redundancy circuit section; and a decoder configured to access one of the plurality of memory cell groups corresponding to the address signal in response to an input of the address signal, and to stop an access to the plurality of memory cell groups in the memory section in response to the selection signal. The redundancy circuit section has a normal mode in which an access to the redundancy memory section is permitted and a redundancy circuit inactivation mode in which an access to the redundancy memory section is prohibited, and the normal mode and the redundancy circuit inactivation mode are changed to each other in response to a first signal.

In a second aspect of the present invention, a memory cell test method is provided for a semiconductor storage device which includes: a memory section including a plurality of memory cell groups; and a redundancy memory cell section including a plurality of memory cell groups. The memory cell test method includes: replacing a first memory cell group in the memory section with a first redundancy memory cell group based on a result of a first memory cell test process including a plurality of memory cell tests performed under a predetermined condition; performing a second memory cell test process including a plurality of memory cell tests for the semiconductor storage device after the replacing a first memory cell group under a different condition; and replacing a second memory cell group being different from the first memory cell group with a second redundancy memory cell group being different from the first redundancy memory cell group based on a result of the second memory cell test process.

According to an embodiment of the present invention, the memory cell test process can be performed under a plurality of conditions by adding a simple logic circuit.

Furthermore, a redundancy circuit provided for selecting the redundancy memory in the storage device can be efficiently used.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6B is a view showing an example of the operations of the memory cell test according to a reference example;

FIG. 15 is a flow chart showing an operation of a memory cell test according to an embodiment of the present invention;

FIG. 16A is a view showing a memory space as an object of a memory cell test in a memory cell test process according to an embodiment of the present invention;

FIG. 16B is a view showing an example of the result of the first memory cell test process on the memory space;

FIG. 16C is a view showing an example of the memory space after the first trimming process;

FIGS. 17A to 17C are views showing an example of the result of a function test in a second memory cell test process according to an embodiment of the present invention;

FIG. 18 is a flow chart showing operations of an inactivation mode test according to an embodiment of the present invention;

FIGS. 19A to 19C are views showing an example of shift of the state of the memory space in an inactivation memory test according to an embodiment of the present invention;

FIG. 20A is a view showing an example of the test result of the second memory cell test process according to an embodiment of the present invention;

FIG. 20B is a view showing an example of the memory space after a second trimming process.

DESCRIPTION OF THE PREFERRED EMBODIMENTS

Figure 1:
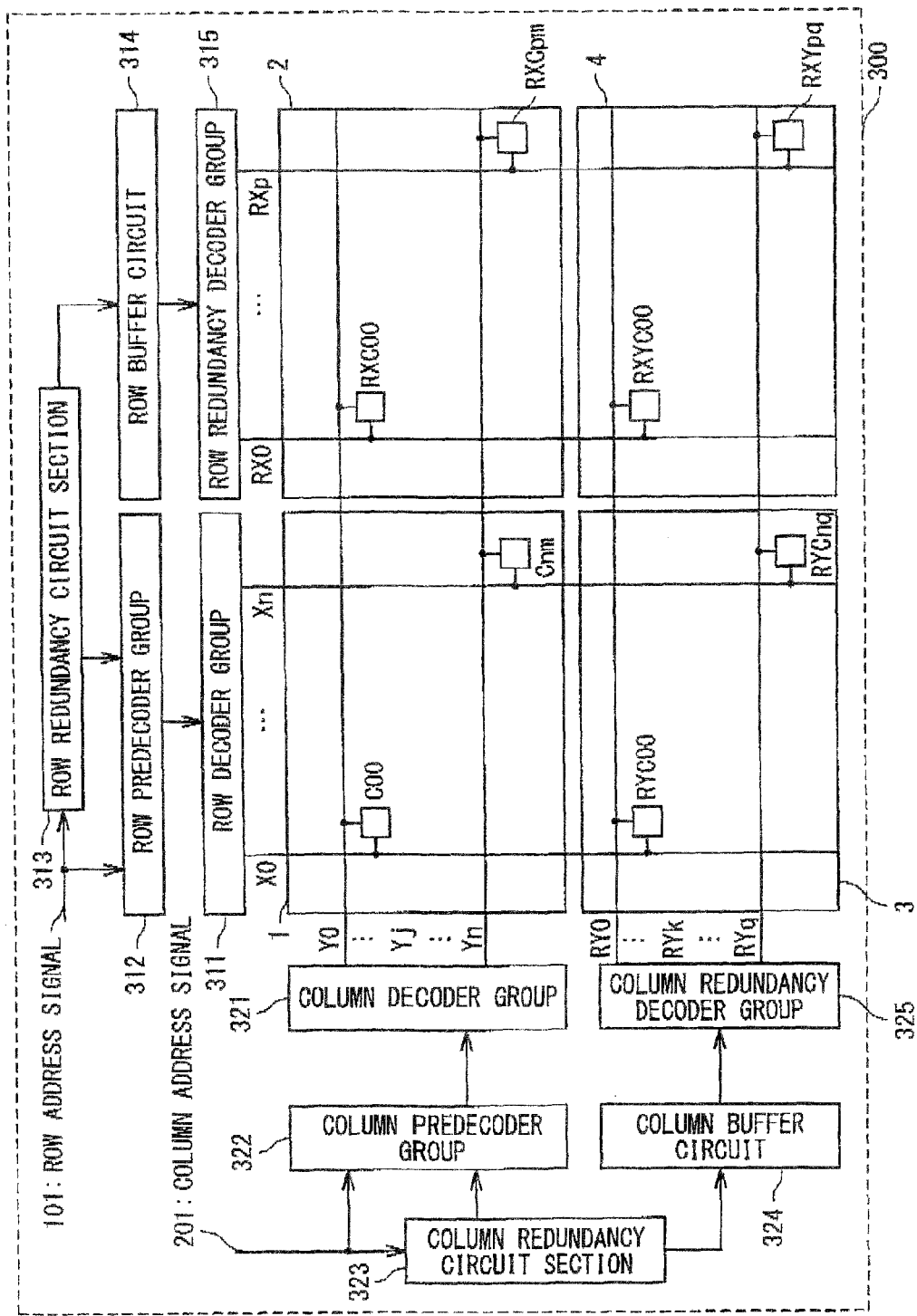
FIG. 1 is a block diagram showing a configuration of a semiconductor storage device according to a reference example.

Hereinafter, a semiconductor storage device and a memory cell test method according to embodiments of the present invention will be described with reference to the attached drawings. In the drawings, the same or similar reference numerals or symbols are given to the same, similar or equivalent configuration components.

[Configuration]

Figure 7:
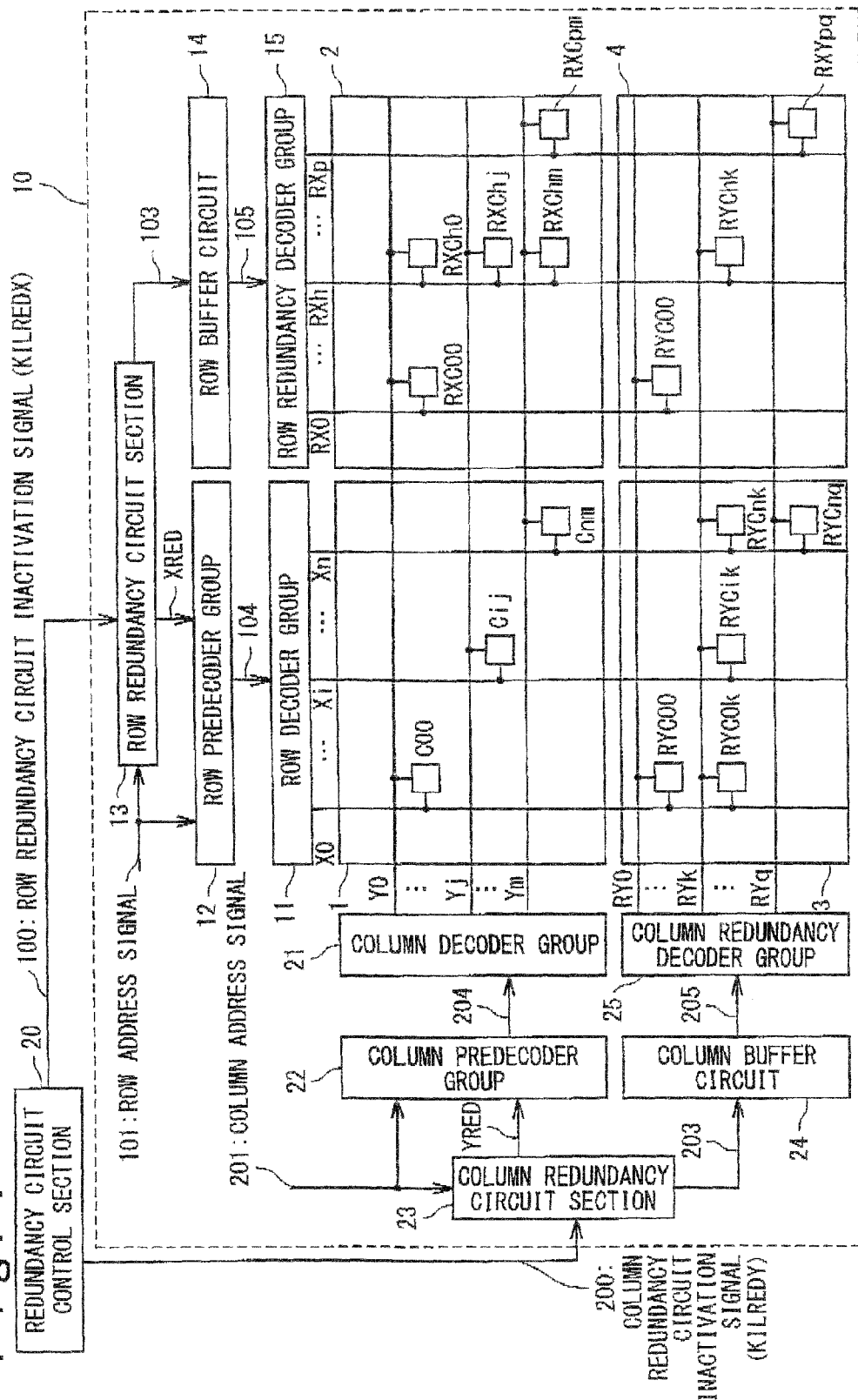
FIG. 7 is a block diagram showing a configuration of a semiconductor storage device according to an embodiment of the present invention.

FIG. 7 is a block diagram showing a configuration of a semiconductor storage device 10 according to an embodiment of the present invention. The semiconductor storage device 10 has a memory section 1, a redundancy row memory section 2, a redundancy column memory section 3, a redundancy row and column memory section 4, a row decoder group 11, a row predecoder group 12, a row redundancy circuit section 13, a row buffer circuit 14, a row redundancy decoder group 15, a column decoder group 21, a column predecoder group 22, a column redundancy circuit section 23, a column buffer circuit 24 and a column redundancy decoder group 25.

The memory section 1 has a plurality of memory cells C00 to Cnm provided in intersection regions between word lines X0 to Xn and digit select lines Y0 to Ym. The redundancy row memory section 2 has a plurality of redundancy row memory cells RXC00 to RXCpm provided in intersection regions between redundancy word lines RX0 to RXp and the digit select lines Y0 to Ym. The redundancy column memory section 3 has a plurality of redundancy column memory cells RYC00 to RYCnq provided in intersection regions between the word lines X0 to Xn and the redundancy digit select lines RY0 to RYq. The redundancy row and column memory section 4 has a plurality of redundancy row and column memory cells RXYC00 to RXYCpq provided in intersection regions between the redundancy word lines RX0 to RXp and redundancy digit select lines RY0 to RYq.

The row decoder group 11 is activated in accordance with a selection signal outputted from the row predecoder group 12 and selects one of the word lines X0 to Xn to activate. The column decoder group 21 is activated in accordance with a selection signal outputted from the column predecoder group 22 and selects one of the digit select lines Y0 to Ym. The row redundancy decoder group 15 activates the redundancy word lines RX0 to RXp in accordance with a selection signal outputted from the row redundancy circuit section via the row buffer circuit 14. The column redundancy decoder group 25 is activated in accordance with a selection signal outputted from the column redundancy circuit section via the column buffer circuit 24 and selects one of the redundancy digit select lines RY0 to RYq.

The row redundancy circuit section 13 selects either the row decoder group 11 or the row redundancy decoder group 15 as a decoder for driving the word line on the basis of fuse circuits built therein and a row address signal 101. The row redundancy circuit section 13 outputs a control signal XRED for determining whether the row decoder group 11 is used or not to the row predecoder group 12. The row redundancy circuit section 13 outputs a row redundancy selection signal 103 to the row buffer circuit 14 on the basis of the fuse circuits built therein and the row address signal 101. The row buffer circuit 14 amplifies the row redundancy selection signal 103 and outputs the amplified signal as a row redundancy selection signal 105 to the row redundancy decoder group 15. When the row decoder group 11 is selected and used, the row redundancy circuit section 13 outputs a selection signal 102 for activating the row predecoder group 12 as well as outputs a row redundancy selection signal 103 for inactivating the row redundancy decoder group 15. In this case, the row predecoder group 12 outputs a row predecode signal 104 to the row decoder group 11 in accordance with the inputted row address signal 101. The row decoder group 11 activates one of the word lines X0 to Xn in accordance with the row predecode signal 104. On the other hand, when the row redundancy decoder group 15 is selected and used, the row redundancy circuit section 13 outputs the row redundancy selection signal 103 as well as outputs the control signal XRED for inactivating the row predecoder group 12. In this case, the row redundancy decoder group 15 activates one of the redundancy word lines RX0 to RXp in accordance with the row redundancy selection signal 105 inputted from the row buffer circuit 14.

The column redundancy circuit section 23 selects either the column decoder group 21 or the column redundancy decoder group 25 as a decoder for selecting the digit select line on a basis of fuse circuits built therein and a column address signal 201. The column redundancy circuit section 23 outputs a control signal YRED for determining whether the column decoder group 21 is used or not to the column predecoder group 22. Furthermore, the column redundancy circuit section 23 outputs a column redundancy selection signal 203 to the column buffer circuit 24 on the basis of the fuse circuits built therein and the column address signal 201. The column buffer circuit 24 amplifies a column redundancy selection signal 203 and outputs the amplified signal as a column redundancy selection signal 205 to the column redundancy decoder group 25. When the column decoder group 21 is selected and used, the column redundancy circuit section 23 outputs a selection signal 202 for activating the column predecoder group 22 as well as outputs a column redundancy selection signal 203 for inactivating the column redundancy decoder group 25. In this case, the column predecoder group 22 outputs a column predecode signal 204 to the column decoder group 21 in accordance with the inputted column address signal 201. The column decoder group 21 selects one of the digit select lines Y0 to Ym in accordance with the column predecode signal 204. On the other hand, when the column redundancy decoder group 25 is selected and used, the column redundancy circuit section 23 outputs the column redundancy selection signal 203 and the control signal YRED for inactivating the column predecoder group 22. In this case, the column redundancy decoder group 25 selects one of the redundancy digit select lines RY0 to RYq in accordance with the column redundancy selection signal 205 inputted from the column buffer circuit 24.

Figure 2:
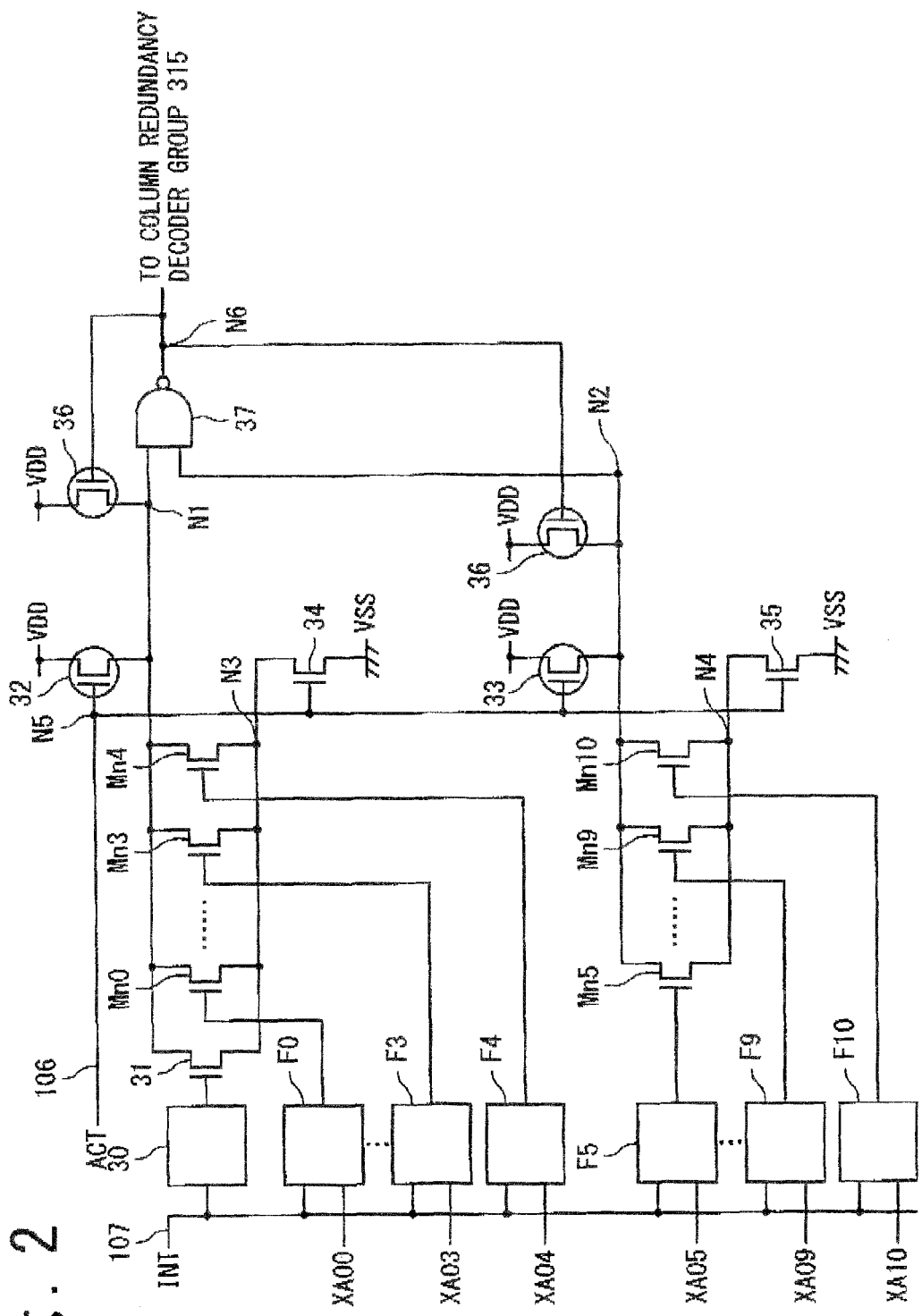
FIG. 2 is a circuit diagram showing a configuration of a row redundancy circuit according to a reference example.

The row redundancy circuit section 13 of this embodiment has a configuration in which a logic circuit activated or inactivated in accordance with a row redundancy circuit inactivation signal 100 outputted from an external redundancy circuit control section 20 is added to the aforementioned reference example. The row redundancy circuit section 13 inactivated by the row redundancy circuit inactivation signal 100 activates the row predecoder group 12 and inactivates the row redundancy decoder group 15 irrespective of the row address signal 101 and fuse circuits (an enable fuse circuit and address fuse circuits similar to those explained in FIG. 2) built therein. Similarly, the column redundancy circuit section 23 has a configuration in which a logic circuit activated or inactivated in accordance with a column redundancy circuit inactivation signal 200 outputted from the external redundancy circuit control section 20 is added to the configuration of the aforementioned first reference example. The column redundancy circuit section 23 inactivated by the column redundancy circuit inactivation signal 200 activates the column predecoder group 22 and inactivates the column redundancy decoder group 25 irrespective of the column address signal 201 and the fuse circuits (the enable fuse circuit and the address fuse circuit) built therein. On the other hand, the row redundancy circuit section 13 activated by the row redundancy circuit inactivation signal 100 selects a decoder for driving the word line in accordance with the row address signal 101 and the fuse circuits built therein. Similarly, the column redundancy circuit section 23 activated by the logic operation column redundancy circuit inactivation signal 200 selects a decoder for selecting the digit select line in accordance with the column address signal 201 and the fuse circuits built therein.

Here, when the row redundancy circuit section 13 and the column redundancy circuit section 23 are inactivated in accordance with the row redundancy circuit inactivation signal 100 and the column redundancy circuit inactivation signal 200, the semiconductor storage device 10 is brought into a redundancy circuit inactivation mode in which only the memory section 1 is accessed irrespective of defect spots of the memory section 1 (namely, access to the redundancy memory cell is prohibited). When the row redundancy circuit section 13 or the column redundancy circuit section 23 is activated in accordance with the row redundancy circuit inactivation signal 100 and the column redundancy circuit inactivation signal 200, the semiconductor storage device 10 is brought into a normal mode in which the defect spots can be replaced with the redundancy memory cell (and access to the redundancy memory cell is set to be available). That is, the semiconductor storage device 10 of this embodiment can switch between the normal mode and the redundancy circuit inactivation mode in accordance with the external row redundant inactivation signal 100 and column redundant inactivation signal 200.

Figure 8:
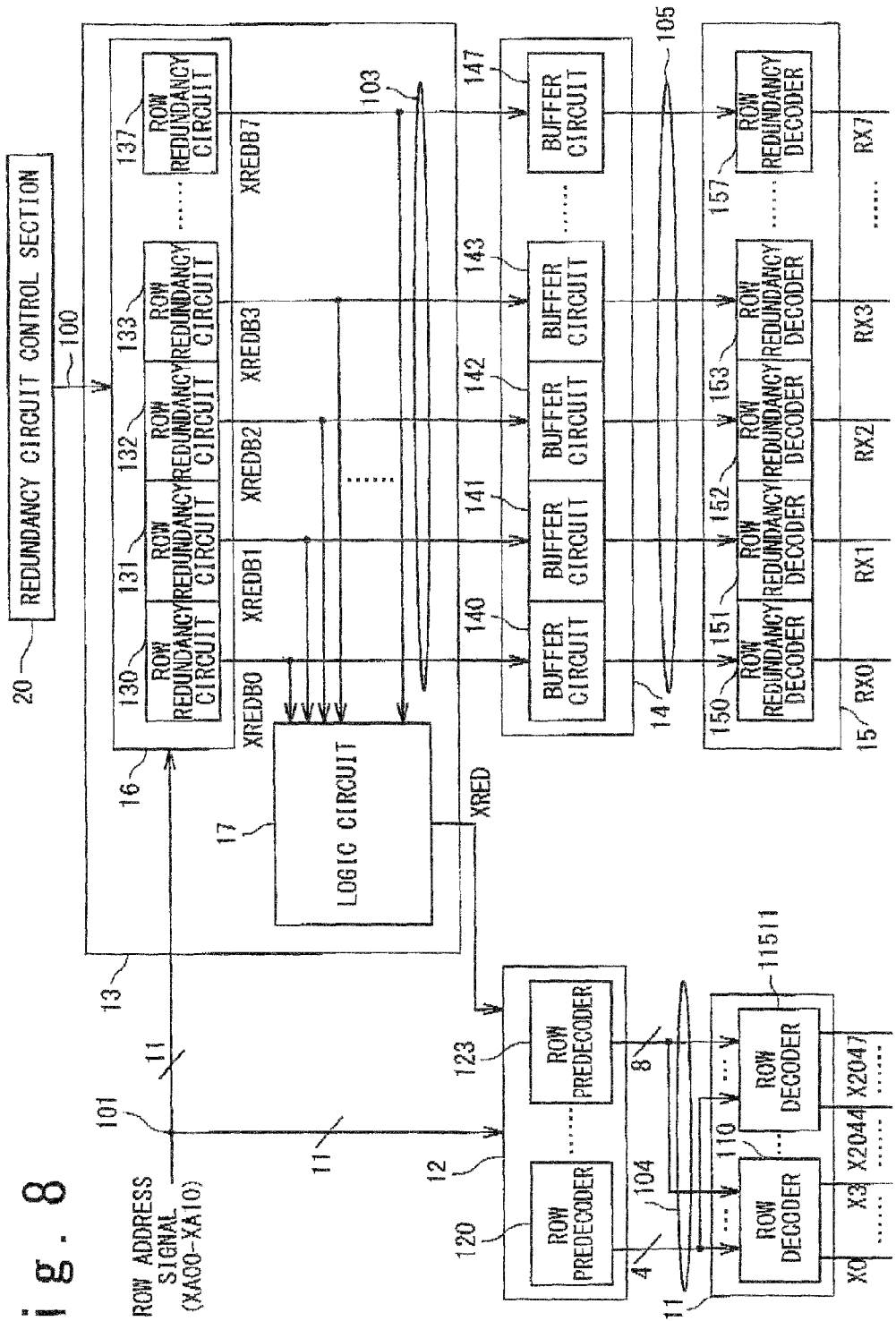
FIG. 8 is a block diagram showing a configuration of the word line side of a semiconductor storage device according to an embodiment of the present invention.
Figure 13:
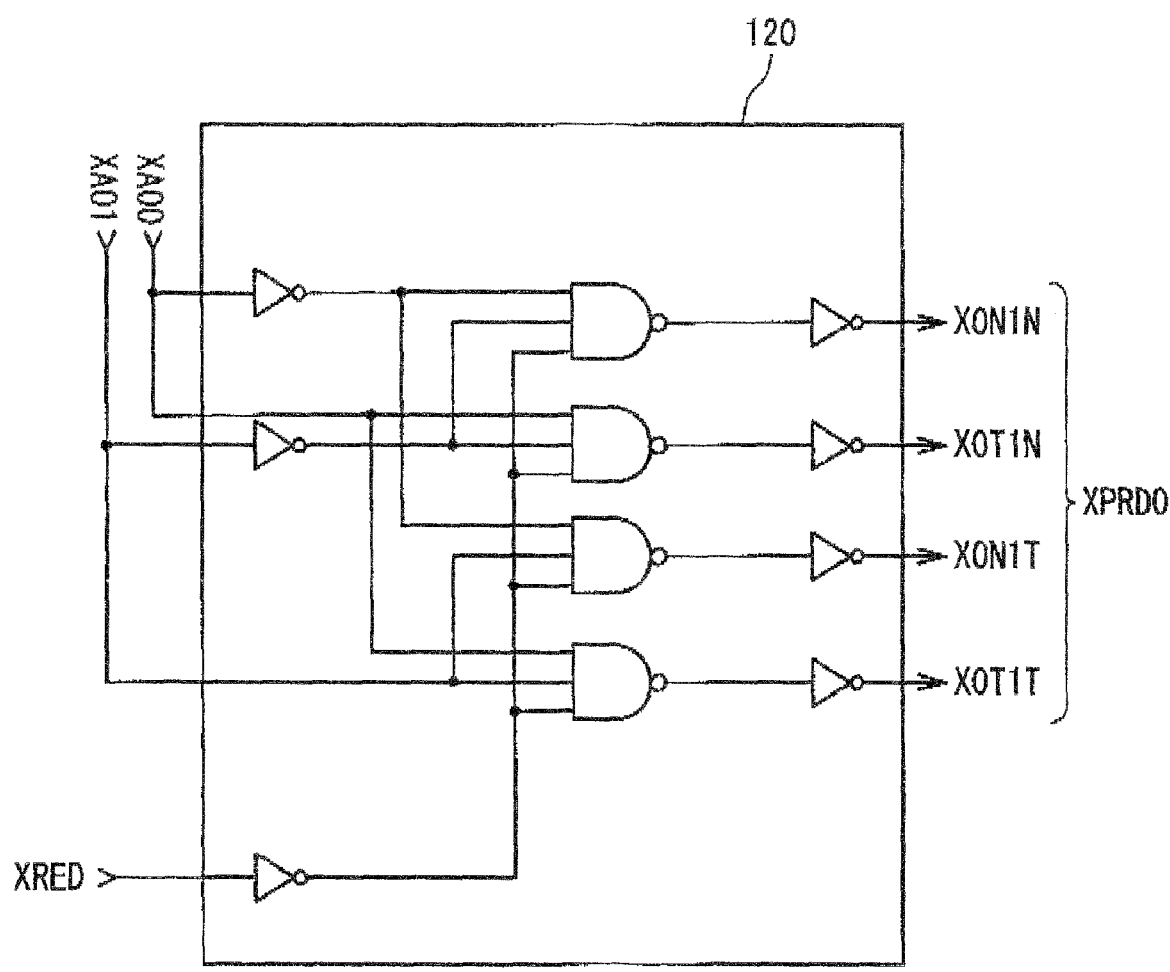
FIG. 13 is a circuit diagram showing a configuration of a row predecoder according to an embodiment of the present invention.

Referring to FIGS. 8 and 13, using the semiconductor storage device having 2048 word lines, 32 digit select lines, 8 redundancy word lines and 8 redundancy digit select lines as an example, a configuration of the semiconductor storage device 10 of this embodiment will be described in detail. Here, it is assumed that: the row address signal 101 (XA00 to XA10) is inputted to the row redundancy predecoder group 12 and the row redundancy circuit section 13; and the column address signal 201 (YA00 to YA04) is inputted to the column redundancy predecoder group 22 and the column redundancy circuit section 23.

FIG. 8 is a detailed view showing a configuration for driving the word lines X0 to X2047 and redundancy word lines RX0 to RX7 in accordance with the row address signals 101. The row redundancy circuit section 13 has a redundancy circuit group 16 including a plurality of row redundancy circuits 130 to 137 and a logic circuit 17 for performing logic operation to outputs of the redundancy circuit group 16 (the selection signal 103). The row redundancy circuits 130 to 137 outputs the row redundancy selection signal 103 (XREDB0 to XREDB7) in accordance with the inputted row address signals 101 (XA00 to XA10). The logic circuit 17 performs logic operation to the row redundancy selection signals 103 (XREDB0 to XREDB7) and outputs the result to the control signal XRED. Here, the NAND of the row redundancy selection signals 103 (XREDB0 to XREDB7) is outputted as the control signal XRED.

The row buffer circuit 14 has a plurality of buffer circuits 140 to 147 respectively corresponding to the row redundancy circuits 130 to 137. The row redundancy decoder group 15 has row redundancy decoders 150 to 157 respectively connected to the redundancy word lines RX0 to RX7. The row redundancy decoders 150 to 157 drives the redundancy word lines RX0 to RX7 in accordance with selection signals XREDB0 to XREDB7 outputted from the corresponding row redundancy circuits 130 to 137 via the buffer circuits 140 to 147.

The row predecoder group 12 has row predecoders 120 to 123. The row address signals 101 (XA00 to XA10) and the control signal XRED are inputted to the row predecoders 120 to 123. The row decoder group 11 has row decoders 110 to 11511 for driving four word lines in accordance with selection signals outputted from the row predecoders 120 to 123. That is, the row decoders 110 to 11511 drive the word lines X0 to X2047.

Figure 9:
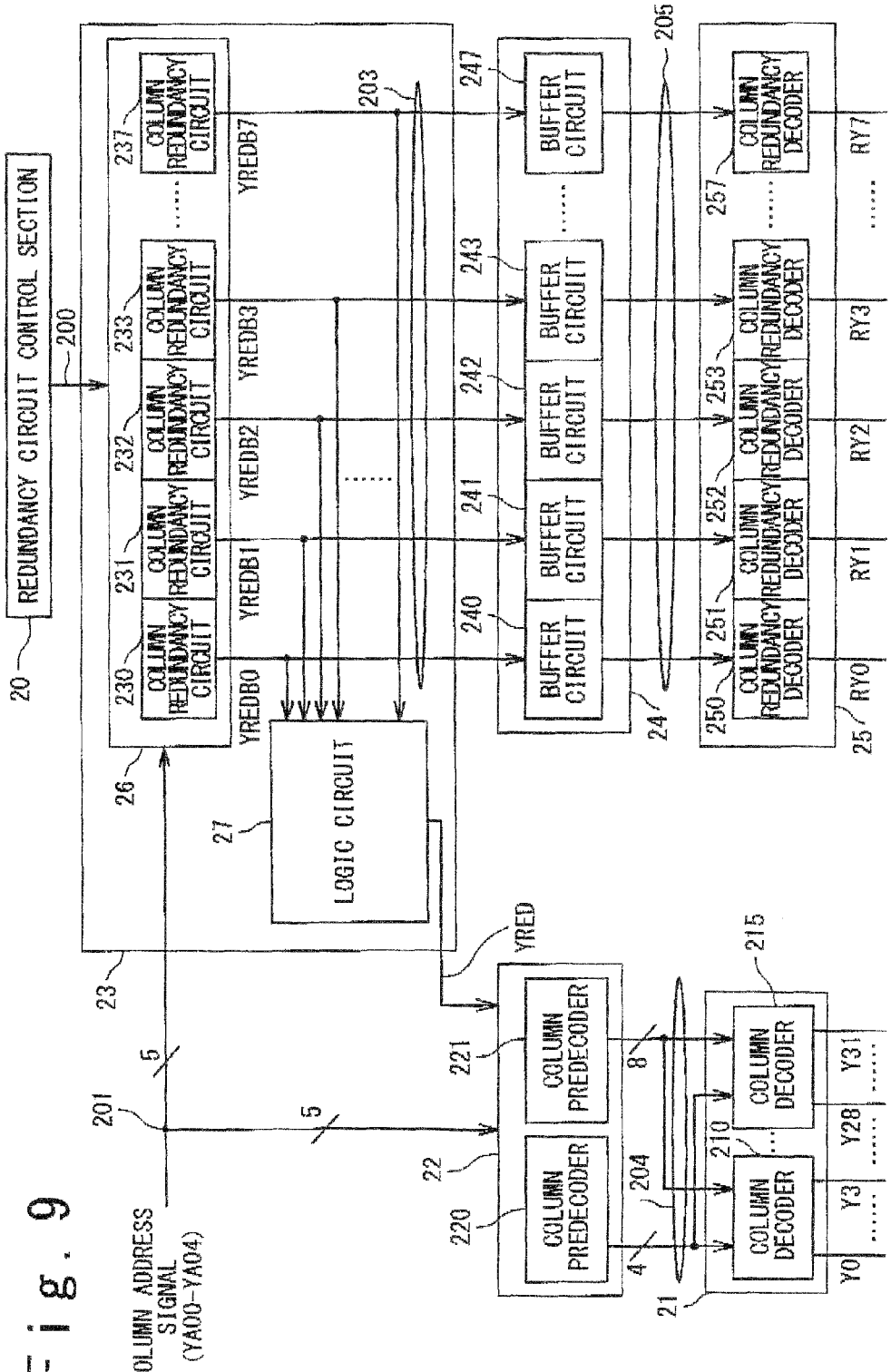
FIG. 9 is a block diagram showing a configuration of the digit select line side of a semiconductor storage device according to an embodiment of the present invention.

FIG. 9 is a detailed view showing a configuration for driving the digit select lines Y0 to Y31 and the redundancy digit select lines RY0 to RY7 in accordance with the column address signals 201. The column redundancy circuit section 23 has a redundancy circuit group 26 including a plurality of column redundancy circuits 230 to 237 and a logic circuit 27 for performing logic operation to outputs of the redundancy circuit group 26 (the column redundancy selection signal 203). Redundancy circuits 230 to 237 outputs the column redundancy selection signals 203 (YREDB0 to YREDB7) in accordance with the input column address signals 201 (YA00 to YA04). The logic circuit 27 performs logic operation to the column redundancy selection signals 203 (YREDB0 to YREDB7) and outputs the result as the control signal YRED. Here, the NAND of the column redundancy selection signals 203 (YREDB0 to YREDB7) is outputted as the control signal YRED.

The column buffer circuit 24 has a plurality of buffer circuits 240 to 247 respectively corresponding to the column redundancy circuits 230 to 237. The column redundancy decoder group 25 has column redundancy decoders 250 to 257 respectively connected to the redundancy digit select lines RY0 to RY7. The column redundancy decoders 250 to 257 drive the redundancy digit select lines RY0 to RY7 in accordance with the selection signals YREDB0 to YREDB7 outputted from the corresponding column redundancy circuits 230 to 237 via buffer circuits 240 to 247.

The column predecoder group 22 has column predecoders 220 and 221. The column address signals 201 (YA00 to YA04) and the control signal YRED are inputted to the column predecoders 220 and 221. The column decoder group 21 has column decoders 210 to 217 for selecting four digit select lines in accordance with selection signals outputted from the column predecoders 220 and 221, respectively. That is, the column decoders 210 to 217 select Y0 to Y31.

A configuration of the row redundancy circuit 130 according to this embodiment of the present invention will be described below in detail. The configuration of the row redundancy circuits 131 to 137 shown in FIG. 8 is the same as that of the row redundancy circuit 130. Since the configuration of the column redundancy circuits 230 to 237 shown in FIG. 9 is basically same as that of the row redundancy circuit, the description of their configuration is omitted.

Figure 10:
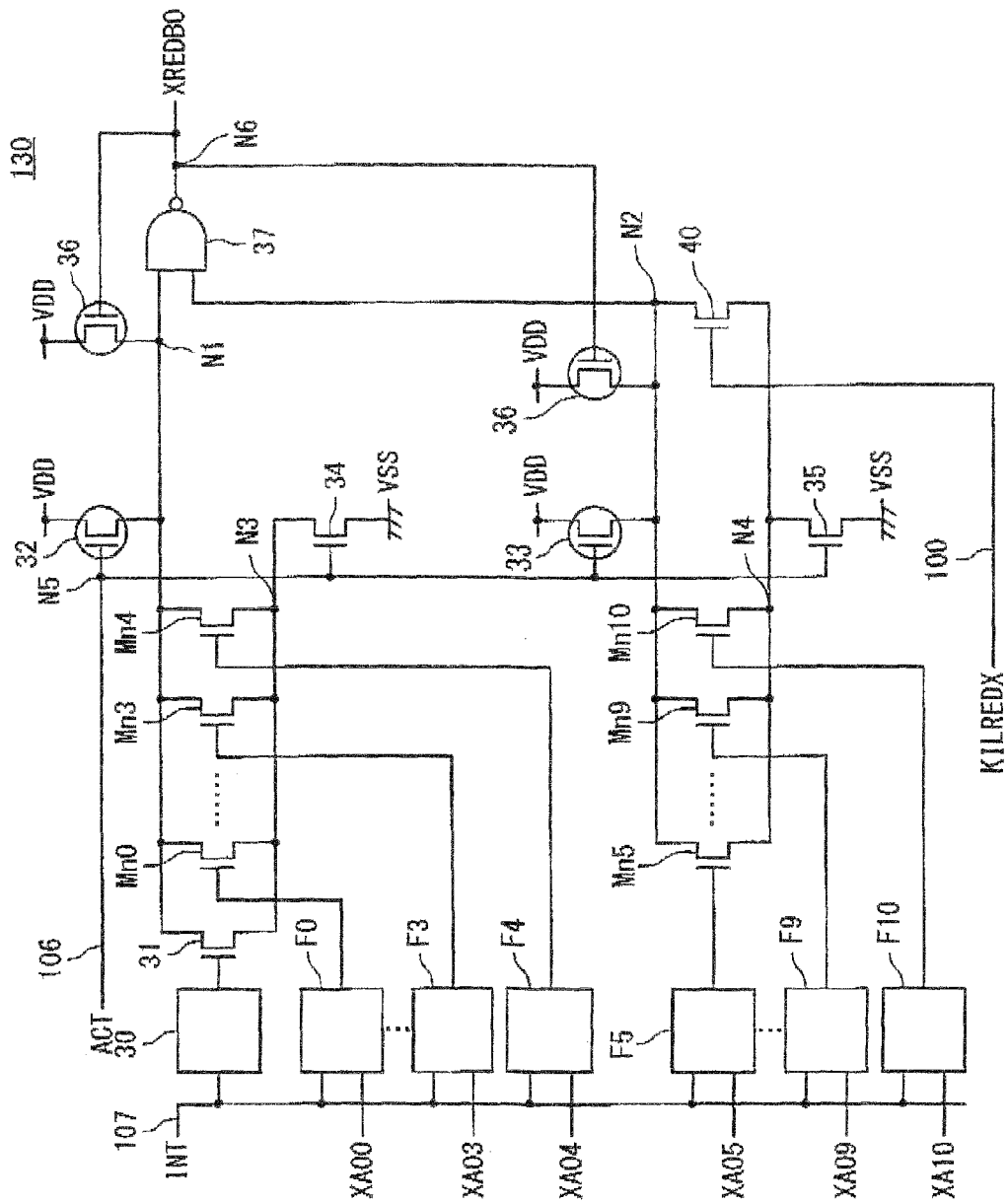
FIG. 10 is a block diagram showing a configuration of a row redundancy circuit according to an embodiment of the present invention.

FIG. 10 is a circuit diagram showing a configuration of the row redundancy circuit 130 of this embodiment. Each row redundancy circuit 130 includes an enable fuse circuit 30 and address fuse circuits F0 to F10, to which an INT signal 107 is inputted, an NMOS transistor 31 connected to the enable fuse circuit 30 at its gate, NMOS transistors Mn0 to Mn10 connected to the address fuse circuits F0 to F10, respectively, at their gates, PMOS transistors 32, 33, 36 connected to a first power source VDD of a high-potential side at their sources, NMOS transistors 34, 35 connected to a second power source VSS of a low-potential side at their sources, a PMOS transistor 36 connected to the node N1 and the node N2 at its drain and its gate receives an input of the selection signal XREDB, a logic circuit 37 for outputting the result of logic operation performed on input signals from the node N1 and the node N2 to the node N6 as the selection signal XREDB0 and an enable control circuit 40 whose gate receives an input of the row redundancy circuit inactivation signal 100. That is, the configuration of the row redundancy circuit 130 is such that the enable control circuit 40 is added to the redundancy circuits according to that of the first reference example shown in FIG. 2.

The drains of the NMOS transistors 31, Mn0 to Mn4 are commonly connected to the drain of the PMOS transistor 32 via the node N1. The sources of the NMOS transistors 31, Mn0 to Mn4 are commonly connected to the drain of the NMOS transistor 34 via the node N3. The drains of the NMOS transistors Mn5 to Mn10 are commonly connected to the drain of the PMOS transistor 33 via the node N2 and sources of the NMOS transistors Mn5 to Mn10 are commonly connected to the drain of the NMOS transistor 35 via the node N4. The gates of the PMOS transistors 32, 33 and the NMOS transistors 34, 35 are commonly connected to the node N5 to which the ACT signal is fed. The PMOS transistors 32, 33 supply the first power source voltage VDD to the nodes N1, N2 in accordance with a signal level of the ACT signal 106. The NMOS transistors 34, 35 feed second power source voltage VSS to the nodes N3, N4 in accordance with the ACT signal 106.

The gates of the PMOS transistors 36 are connected to the node N6 and the drains of the PMOS transistors 36 are respectively connected to the nodes N1, N2. When the row redundancy circuit 130 is in the activated state, the PMOS transistors 36 compensate levels of the nodes N1, N2. In other words, when the selection signal XREDB0 is at the "L" level, the first power source voltage VDD is supplied to the nodes N1, N2 kept at the "H" level.

The logic circuit 37 in this embodiment is the NAND circuit for outputting NAND of input signals from the nodes N1, N2 as the selection signal XREDE0. In this case, when a signal of the "L" level is inputted to at least one of the nodes N1, N2, the logic circuit 37 outputs the selection signal XREDB0 of the "H" level. When the signal levels of both the nodes N1, N2 are the "H", the logic circuit 37 outputs the selection signal XREDB0 of the "1" level.

The signal level at the node N1 is determined depending on the driving condition of the NMOS transistors 31, Mn0 to Mn4. The signal level at the node N2 is determined depending on the driving condition of the NMOS transistors Mn5 to Mn10 and the control applied by the enable control circuit 40. The driving condition of the NMOS transistor 31 is determined depending on the connection/disconnection state of the fuse 51 in the enable fuse circuit 30 (refer to FIG. 3). The driving condition of the NMOS transistors Mn0 to Mn10 are determined depending on the connection/disconnection state of the fuse 51 of the FUSE circuit 60 provided in each of the address fuse circuits F0 to F10 (refer to FIG. 4) and the row address signals XA00 to XA10.

The enable control circuit 40 controls the signal level at the node N2 in accordance with the row redundancy circuit inactivation signal 100 (KILREDX). In this embodiment, the NMOS transistor which has the gate connected to KILREDX, the drain connected to the node N2 and the source connected to the second power source VSS via the node N4 forms the enable control circuit 40. In this case, when the row redundancy circuit inactivation signal 100 is at the "H" level, the enable control circuit 40 is turned on and transitions the signal level at the node N2 to the "L" level. When the row redundancy circuit inactivation signal 100 is at the "L" level, the enable control circuit 40 is turned off and the node N2 is at the signal level determined by the NMOS transistors 31, Mn0 to Mn10. As described above, the enable control circuit 40 can transit the signal level at the node N2 to the "L" level irrespectively of the connection/disconnection state of the fuses 51 in the enable fuse circuit 30 and the address fuse circuits F0 to F10.

Figure 3:
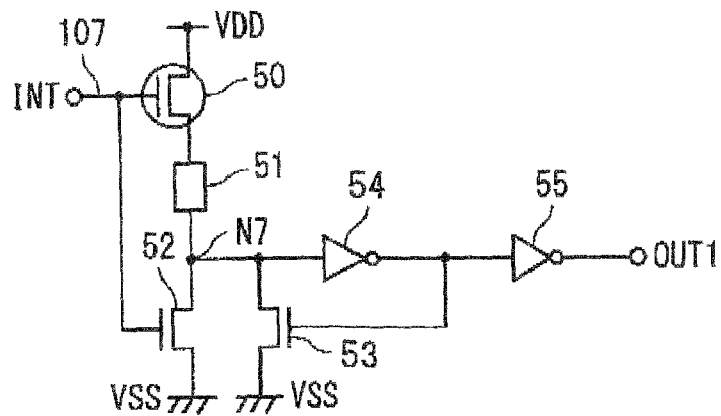
FIG. 3 is a circuit diagram showing a configuration of an enable fuse circuit according to an embodiment of the present invention.

The NMOS transistor 31 determines the signal level at the node N1 in accordance with the signal level inputted from the enable fuse circuit 30. The enable fuse circuit 30 determines the signal level inputted to the gate of the NMOS transistor 31 in response to the signal level of the INT signal 107 and the connection/disconnection state of the fuse 51 built therein. Referring to FIG. 3, a configuration of the enable fuse circuit 30 will be described in detail.

The enable fuse circuit 30 in this embodiment is implemented as the FUSE circuit 60 shown in FIG. 3. The FUSE circuit 60 has the PMOS transistor 50, a fuse 51, NMOS transistors 52, 53 and inverters 54, 55. The PMOS transistor 50 and the NMOS transistor 52 form an inverter having the INT signal 107 as an input and the node N7 as an output. The fuse 51 is connected between the drain of the PMOS transistor 50 and the node N7. The node N7 is connected to the output terminal OUT1 via the inverters 54, 55. The output terminal OUT1 of the enable fuse circuit 30 is connected to the gate of the NMOS transistor 31 shown in FIG. 10. The gate of the NMOS transistor 53 is connected to the output of the inverter 54 and the drain thereof is connected to the node N7. The NMOS transistor 53 fixes the output level of the inverter 54.

Here, the INT signal 107 is a one-shot pulse signal which is at the "H" level only at a period just after turned-on and then, is put into the "L" level. The INT signal 107 may be a signal inputted from an outside signal or generated in the semiconductor storage device 10.

When the fuse 51 is fused, the signal level at the output terminal OUT1 becomes "L" in accordance with the one-shot INT signal 107 of the "H" level. In this case, the NMOS transistor 31 is turned off and the signal level at the node N1 is determined by the NMOS transistors Mn0 to Mn4. On the other hand, when the fuse 51 is not fused, the PMOS transistor 50 and the NMOS transistor 52 operate as an inverter and the signal level of the output terminal OUT1 becomes "H" in accordance with the INT signal 107 of the "L" level after the one-shot pulse. In this case, the signal level at the node N1 is lowered by the NMOS transistor 31 and becomes the "L" level. That is, in a trimming process, the fuse 51 is fused for setting the row redundancy circuit 130 to the activated state and is not fused for setting it to the inactivated state.

Referring to FIG. 10, NMOS transistor Mn0 to Mn10 determine the signal level of each of the node N1 or N2 in accordance with the signal levels inputted from the address fuse circuits F0 to F10, respectively. The address fuse circuits F0 to F10 determine the signal levels inputted to the gates of the NMOS transistors Mn0 to Mn10 in accordance with the signal levels of the INT signal 107 and the row address signals XA00 to XA10 and the connection/disconnection state of the fuse 51 built therein.

Figure 4:
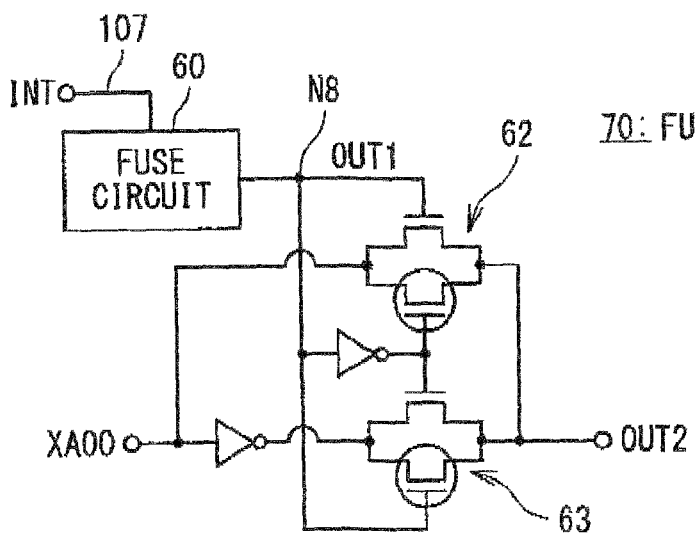
FIG. 4 is a circuit diagram showing a configuration of an address fuse circuit according to an embodiment of the present invention.

Each of the address fuse circuits F0 to F10 is implemented by the FUSE circuit 70 shown in FIG. 4. FIG. 4 is a circuit diagram showing a configuration of the address fuse circuit F0. Configurations of the address fuse circuits F1 to F10 are the same as that of the address fuse circuit F0. The FUSE circuit 70 has a FUSE circuit 60 connected between a terminal to which the INT signal 107 is inputted and the node N8, a transfer gate 62 which is controlled by a complementary signal from the node N8 and outputs a signal corresponding to the row address signal XA00 to an output terminal OUT2 (the gate of the NMOS transistor Mn0) and a transfer gate 63 which is controlled by a complementary signal from the node N8 and outputs a signal corresponding to an inversion signal of the row address signal XA00 to the output terminal OUT2. Here, the output terminal OUT1 of the FUSE circuit 60 provided in each of the address fuse circuits F0 to F10 is connected to the node N8. As described above, the INT signal 107 is outputted as a one-shot pulse signal of the "H" level only at turn-on period and then, is put into the "L" level. Hereinafter, the fuse 51 provided in any of the address fuse circuits F0 to F10 is referred to as an address fuse.

When an address fuse is fused, the signal level of the output terminal OUT2 becomes the inverted signal level of the row address signal XA00 in accordance with the one-shot INT signal 107 of the "H" level. On the other hand, when the fuse 51 is not fused, the signal level of the output terminal OUT2 becomes a same signal level as that of the row address signal XA00.

For example, for setting the row redundancy circuit 130 to the activated state under the condition that the row address signal XA00 is at the "H" level, the address fuse is fused. In this case, in accordance with the row address signal XA00 of the "H" level, the gate of the NMOS transistor Mn0 becomes the "L" level and the node N1 transitions to the "H" level. Conversely, in accordance with the row address signal XA00 of the "L" level, the gate of the NMOS transistor Mn0 becomes the "H" level and the node N1 transitions to the "L" level.

On the other hand, for setting the row redundancy circuit 130 to the activated state under the condition that the address signal XA00 is at the "L" level, the address fuse is not fused. Correspondence between combination of signal levels of the address signals XA00 to XA10 for bringing a row redundancy circuit 130 into the activated state and the connection/disconnection state of the address fuse can be appropriately set for each row redundancy circuit and each address fuse circuit.

In FIG. 10, while the ACT signal 106 is at the "L" level, the PMOS transistors 32, 33 transition the nodes N1, N2 to the "H" level and the NMOS transistors 34, 35 keep the nodes N3, N4 at the "H" level. That is, during this time, the nodes N1 to N4 are precharged.

When the ACT signal 106 is at the "H" level, precharge of the nodes N1 to N4 is released and the NMOS transistors 34, 35 are set to conducting state. Here, if the fuse 51 of the enable fuse circuit 30 is not fused and its output to the NMOS transistor 31 is at the "H" level, the node N1 is at the "L" level irrespectively of combination of the address signals XA00 to XA10, and the row redundancy circuit section 13 is inactivated. If the fuse 51 of the enable fuse circuit 30 is fused and the output to the NMOS transistor 31 is at the "L" level, activation/inactivation of the row redundancy circuit section 13 is determined depending on combination of the address signals XA00 to XA10. For example, if the address fuse is fused in accordance with combination of the address signals XA00 to XA10 which activates the row redundancy circuit 130, the output levels of all of the address fuse circuits F0 to F10 becomes the "L" level and the nodes N1, N2 are kept at the "H" level. Thereby, the selection signal XREDB0 becomes the "L" level and the row redundancy word lines RX0 (row redundancy memory cell) is selected.

Regardless to the connection/disconnection states of the address fuse circuits F0 to F10, it is possible to activate the row redundancy circuit 130 with some sort of address information. When the row redundancy circuit 130 is not used, since it is required to achieve the inactivated state independently of the address information, the enable fuse circuit 30 is required.

As described above, whether the row redundancy circuit 130 is used or not is determined by the enable fuse circuit 30 and when the row redundancy circuit 130 is used, activation/inactivation of the row redundancy circuit 130 is determined depending on the address fuse circuits F0 to F10 and the row address signals XA00 to XA10. The selection signal XREDB0 outputted from the activated row redundancy circuit 130 drives the row redundancy decoder 150 and activates the redundancy word line X0. In this embodiment, when the row redundancy circuit 130 is activated, the selection signal XREDB0 of the "L" level is outputted. The row redundancy circuit 130 of this embodiment can inactivate the row redundancy circuit 130 by the enable control circuit irrespectively of the connection/disconnection state of the enable fuse circuit 30 and the address fuse circuits F0 to F10.

The use/nonuse (which corresponds to not available/available) of the respective row redundancy circuits 131 to 137 is determined depending on the connection/disconnection of the fuse circuits in a trimming process similarly to the row redundancy circuit 130. The row redundancy circuits among the circuits 131 to 137 which are used activate the redundancy word lines among the lines RX1 to RX7, respectively, in accordance with combination of signal levels of the row address signals XA00 to XA10 and the connection/disconnection state of the address fuse circuits F0 to F10.

In FIG. 8, when some of the row redundancy circuits 130 to 137 are activated, that is, some of the selection signals XREDB0 to XREDB7 become the "L" level, the control signal XRED outputted from the logic circuit 17 is put into the "H" level and the row predecoder group 12 and the row decoder group 11 are inactivated. Thereby, an access to a defective memory cell by the decoder for driving the primary memory section is prohibited. Namely, it is possible to stop an access to a defective memory cell and get access to the row redundancy memory cell corresponding to the address signal for selecting the defective memory cell.

Figure 11:
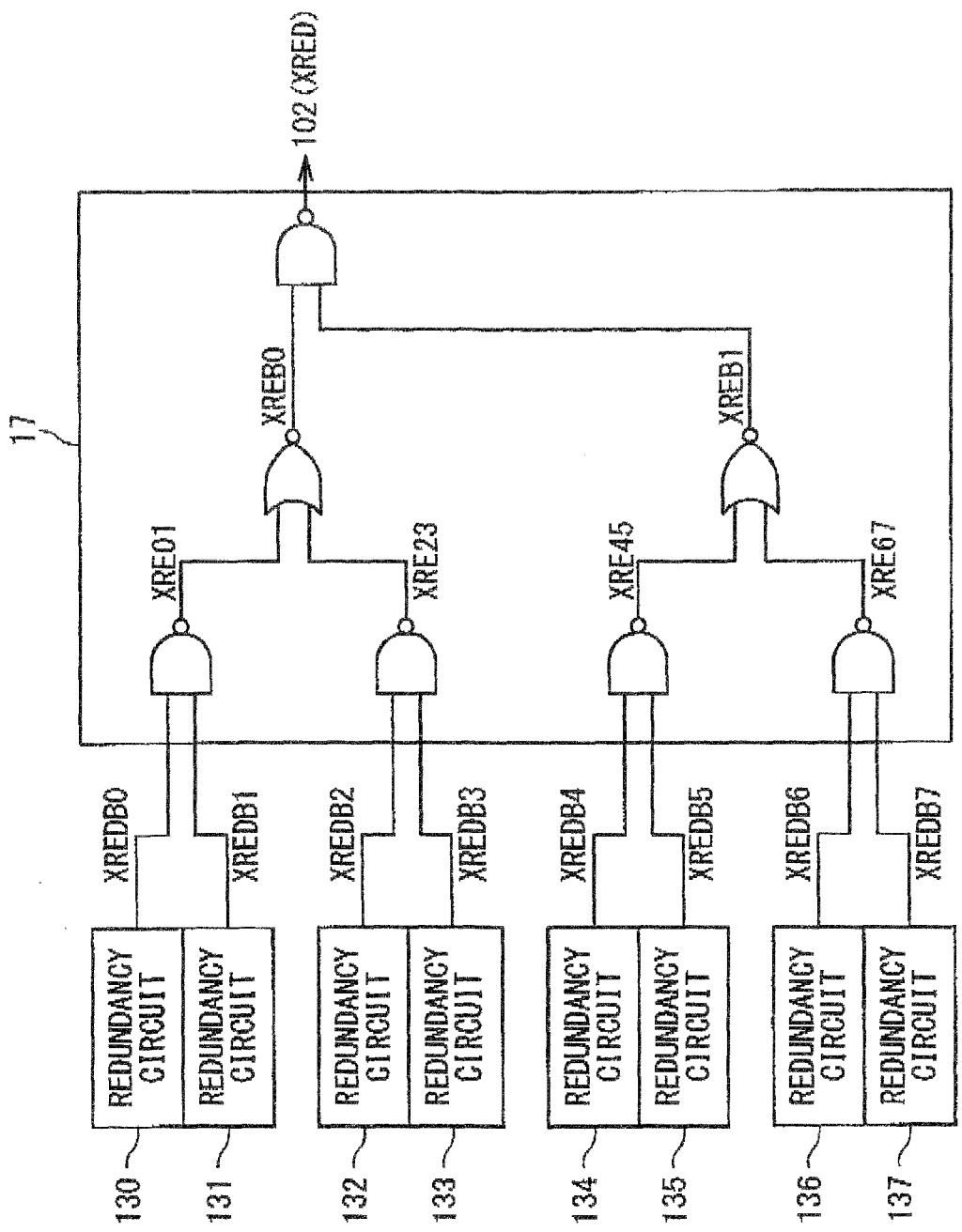
FIG. 11 is a circuit diagram showing a configuration of a logic circuit for performing a logic operation to output a selection signal outputted from a redundancy circuit according to an embodiment of the present invention.

FIG. 11 shows a configuration of the logic circuit 17 shown in FIG. 8. The logic circuit 17 has four NAND circuits for outputting negative—and calculation results XRE01 to XRE67 of the selection signals, respectively, from pairs of two redundancy circuits among the row redundancy circuits 130 to 137, two NOR circuits for outputting two negative—or calculation results XREB0, XREB1 among negative—and XRE01 to XRE67, respectively, and NAND circuit for outputting NAND of negative—or XREB0, XREB1 as the control signal XRED. With such configuration, the logic circuit 17 outputs negative—and of the selection signals XREDB0 to XRED7 outputted from the row redundancy circuits 130 to 137 as the control signal XRED.

Figure 12:
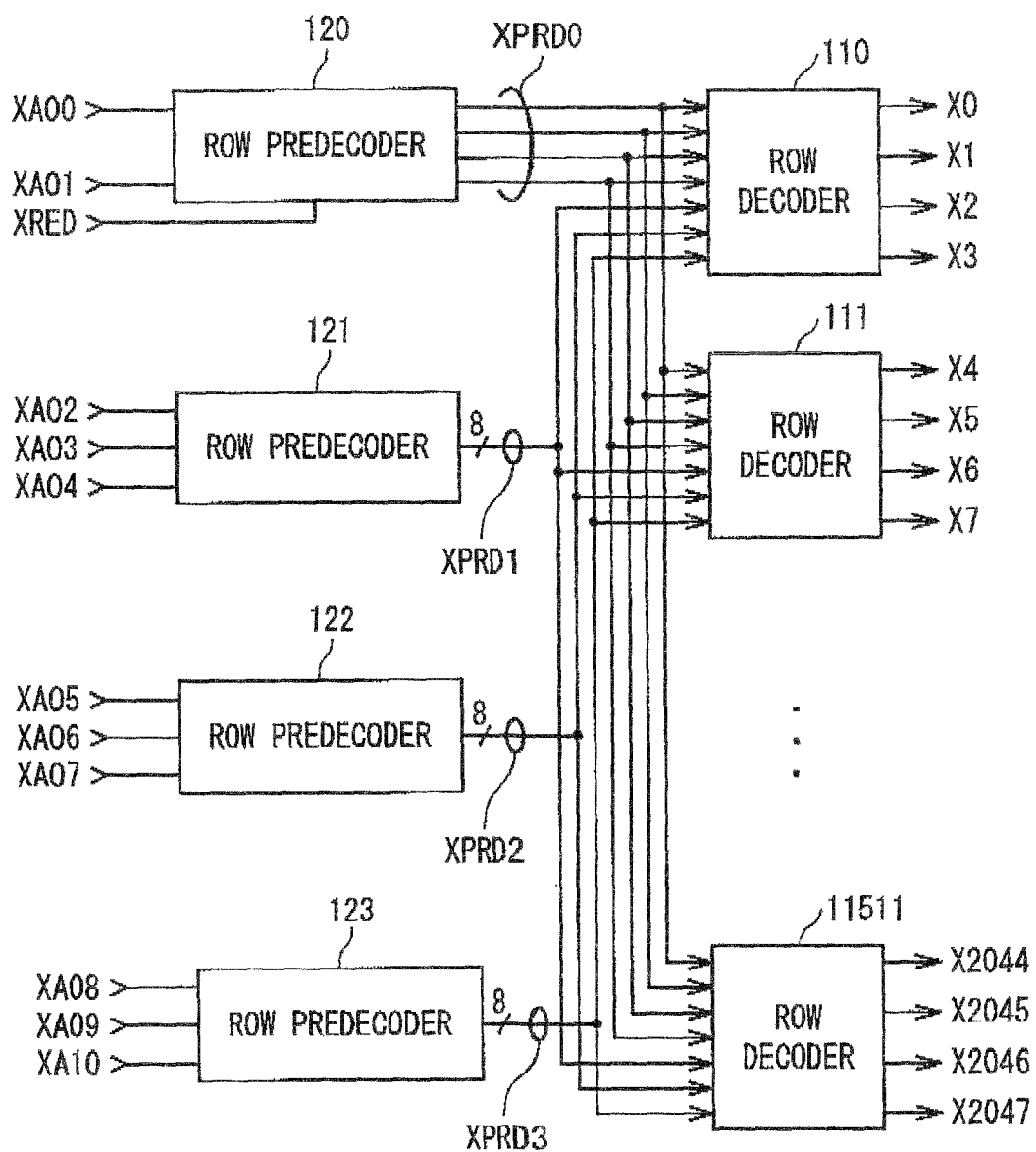
FIG. 12 is a block diagram showing connection relationship of a row pre decoder and a row decoder according to an embodiment of the present invention.

FIG. 12 shows connection relationship of the row predecoders 120 to 123 and the row decoders 110 to 1511 shown in FIG. 8. The row predecoder 120 outputs the selection signals XPRD0 of the signal level corresponding to the address signals XA00, XA01 to be inputted and the control signal XRED to the row decoders 110 to 11511 to control the signal levels of the four selection signals outputted from the row decoders 110 to 11511. The row predecoder 120 determines activation/inactivation of all of the row decoders 110 to 11511 in accordance with the control signal XRED to be inputted. In accordance with three address signals XA02 to XA04, XA05 to XA07, and XA08 to XA10 inputted to the row predecoders 121 to 123, respectively, the selection signals XPRD1 to XPRD3 are outputted to the row decoders 110 to 11511, thereby activating one of the row decoders 110 to 11511.

FIG. 13 shows a configuration of the row predecoder 120 shown in FIG. 8. The row predecoder 120 has: inverters for inverting the control signal XRED, address signals XA00, XA01; four NAND circuits for outputting negative—and calculation result of pairs of two signals obtained by combining the address signals XA00, XA01 with their inversion signals, and the control signal XRED; and four inverters for inverting outputs of the four NAND circuits to output the inverted signals as four selection signals X0N1N, X0T1N, X0N1T, X0T1T. The four selection signals X0N1N, X0T1N, X0N1T, X0T1T are outputted from the row predecoder 120 as the selection signal XPRD0. Each of the row predecoders 121 to 123 has a same configuration as the row predecoder 20 except that the address signal in place of the control signal XRED is inputted and outputs each of the selection signals XPRD1 to XPRD3, respectively.

In FIG. 13, each of the row decoders 110 to 11511 determines a signal level of the selection signal outputted to the word line connected thereto according to combination of the signal levels of the selection signals XPRD0 to XPRD3 outputted from the row predecoders 120 to 123. Describing in detail, when the row decoder 110 is activated in accordance with the selection signals XPRD1 to XPRD3 outputted from the row predecoders 121 to 123, the row decoder 110 activates one of the word lines X0 to X3 in accordance with the selection signal XPRD0 received from the row predecoder 120.

[Salvation Operation for Defective Spots in the Normal Mode]

A salvation operation of a defective spot in the normal mode will be described in detail. Here, it is assumed that the row redundancy circuit inactivation signal 100 (KILREDX) and the column redundancy circuit inactivation signal 200 (KILREDY) are at the "L" level in the normal mode and at the "H" level in the redundancy circuit inactivation mode.

Referring to FIG. 8, in the normal mode, the row redundancy circuit inactivation signal 100 of the "L" level is inputted from the redundancy circuit control section 20 to the row redundancy circuit section 13. The enable control circuit 40 shown in FIG. 10 is turned off in accordance with the redundancy circuit inactivation signal 100 of the "L" level and the signal level at the node N2 is determined depending on the address fuse circuits F0 to F10. That is, the defect spot is salvaged in accordance with the address fuse circuits F0 to F10 of the row redundancy circuits 130 to 137 and the enable fuse circuit 30 which are set by trimming process in the normal mode. Similarly, referring to FIG. 9, the column redundancy circuit inactivation signal 200 in the normal mode is inputted to the column redundancy circuit section 23.

Thereby, as in the row redundancy circuits 130 to 137, the defect spot is salvaged in accordance with the address fuse circuits F0 to F10 of the column redundancy circuit 230 to 237 and the enable fuse circuit 30.

Referring to FIGS. 7 and 8, for example, when a memory cell Cij is detected as a defective memory cell, the memory cell Cij is salvaged by being replaced with a redundancy memory cell RXChj or a redundancy memory cell RXCik.

In a case where the memory cell Cij is replaced with the redundancy memory cell RXChj, the row redundancy circuit section 13 outputs the row redundancy selection signal 103 for driving the redundancy word line RXh as well as the control signal XRED for inactivating the row predecoder group 12. Describing in detail, the row redundancy circuit 13h corresponding to the redundancy word line RXh outputs the selection signal XREDBh of the "L" level in accordance with a row address signal for selecting the memory cell Cij. The row redundancy decoder group 15 activates the redundancy word line RXh in accordance with the selection signal XREDBh of the "L" level. The logic circuit 17 outputs the control signal XRED of the "H" level in accordance with the selection signal XREDBh of the "L" level. The row predecoder group 12 is inactivated in accordance with the control signal XRED of the "H" level.

On the other hand, the column redundancy circuit section 23 is inactivated in accordance with the column address signal, outputs the column redundancy selection signal 203 for inactivating the column redundancy decoder group 25 and outputs the control signal YRED for activating the column predecoder group 22. Describing in detail, the column redundancy circuit group 26 outputs the column redundancy selection signal 203 of the "H" level in accordance with the column address signal for selecting the digit select line Yj. The column redundancy decoder group 25 inactivates all of the redundancy digit select lines RY0 to RYn in accordance with the column redundancy selection signal 203 of the "H" level. The logic circuit 27 outputs the control signal YRED of the "L" level in accordance with the column redundancy selection signal 203 of the "H" level. The column predecoder group 22 is activated in accordance with the control signal YRED of the "L" level and the column decoder group 21 selects the digit select line Yj in accordance with the column address signal for selecting the digit select line Yj.

As described above, in a case where the memory cell Cij is replaced with the redundancy memory cell RXChj, the redundancy word line RXh and the digit select line Yj are activated in accordance with the address signal for selecting the memory cell Cij. On the other hand, in the case where the memory cell Cij is replaced with the redundancy memory cell RYCik, as described above, the word line Xi and the redundancy digit select line RYk are activated in accordance with the address signal for selecting the memory cell Cij.

When the word line Xi is defective, the word line Xi is replaced with the redundancy word line RXh. Thereby, in accordance with the row address signal for selecting the word line Xi, the row redundancy decoder group 15 selects the redundancy word line RXh and the row decoder group 11 is inactivated. The column decoder group 21 activates one of the digit select lines Y0 to Ym in accordance with the column address signal 201, and the column redundancy decoder group 25 inactivates the redundancy digit select lines RY0 to RYq. Thereby, the memory cell on the word line Xi is replaced with corresponding one of the redundancy memory cells RXCh0 to RXChm on the redundancy word line RXh.

Similarly, when a digit select line Yj is defective, the digit select line Yj is replaced with the redundancy digit select line RYk. Thereby, the column redundancy decoder group 25 selects the redundancy digit select line RYk in accordance with the column address signal for selecting the digit select line Yj, and the column decoder group 21 is inactivated. The row decoder group 11 inactivates any of the word lines X0 to Xn in accordance with the row address signal 101, and the row redundancy decoder group 15 inactivates the redundancy word lines RX0 to RXp. Thereby, the memory cell on the digit select line Yj is replaced with corresponding one of the redundancy memory cells RYC0k to RYCnk on the redundancy digit select line RYk.

Furthermore, when both of the word line Xi and the digit select line Yj are defective, the memory cell Cij provided in an intersection region between the word line Xi and the digit select line Yj is replaced with the redundancy memory cell RXYChk on the row and column redundancy memory section 4. Describing in detail, in accordance with the row address signal for selecting the memory cell Cij, the row redundancy circuit section 13 inactivates the row predecoder group 12 and outputs the row redundancy selection signal 103 for selecting the redundancy word line RXh. In accordance with the column address signal for selecting the memory cell Cij, the column redundancy circuit section 23 inactivates the column predecoder group 22 and outputs the column redundancy selection signal 203 for selecting the redundancy digit select line RYk. Thereby, the memory cell Cij is replaced with the redundancy memory cell RXYChk.

As described above, in the normal mode, a defect spot in the memory section 1 is salvaged based on the address fuse information set for the address fuse circuits F0 to F10 and the enable information set in the enable fuse circuit 30 in the row redundancy circuit section 13 and the column redundancy circuit section 23.

[Operation in Redundancy Circuit Inactivation Mode]

An operation in the redundancy circuit inactivation mode will be described below.

Referring to FIG. 8, in the redundancy circuit inactivation mode, the row redundancy circuit inactivation signal 100 of the "H" level is inputted from the redundancy circuit control section 20 to the row redundancy circuit section 13. The enable control circuit 40 shown in FIG. 10 is turned on in accordance with the redundancy circuit inactivation signal 100 of the "H" level and the signal level at the node N2 is lowered to the "L" level irrespectively of the address fuse circuits F0 to F10. Thus, the selection signal XREDB outputted from, the logic circuit 37 is put into the "H" level and all of the row redundancy selection signals 103 (the selection signals XREDB0 to XREDB7) outputted from the row redundancy circuit section 13 shown in FIG. 8 is put into the "H" level. In accordance with the row redundancy selection signals 103 of the "H" level, the logic circuit 17 outputs the control signal XRED of the "L" level to the row predecoder group 12. Thereby, the row predecoder group 12 and the row decoder group 11 are activated and activate one of the word lines X0 to X2047 in accordance with the row address signal 101. On the other hand, the row redundancy decoder group 15 is inactivated in response to the row redundancy selection signals 103 of the "H" level.

In FIG. 9, in the redundancy circuit inactivation mode, the column redundancy circuit, inactivation signal 200 of the "H" level is inputted from the redundancy circuit control section 20 to the column redundancy circuit section 23. In accordance with the column redundancy circuit inactivation signal 200 of the "H" level, the column redundancy circuit section 23 is inactivated and outputs the column redundancy selection signals 203 (the selection signals YREDB0 to YREDB7) of the "H" level. The logic circuit 27 outputs the control signal YRED of the "L" level in accordance with the column redundancy selection signals 203 of the "H" level to the column predecoder group 22. Thereby, the column predecoder group 22 and the column decoder group 21 are activated and activate one of the digit select lines Y0 to Y31 in accordance with the column address signal 201. On the other hand, the column decoder group 25 is inactivated in response to the column redundancy selection signal 203 of the "H" level.

As described above, in the redundancy circuit inactivation mode, irrespectively of the address fuse information and the enable information set in the redundancy circuit section, the redundancy circuit (the redundancy memory cell) is not used and only the memory section 1 is accessed.

[Comparison Between Normal Mode and Redundancy Circuit Inactivation Mode in Operation]

Figure 14:
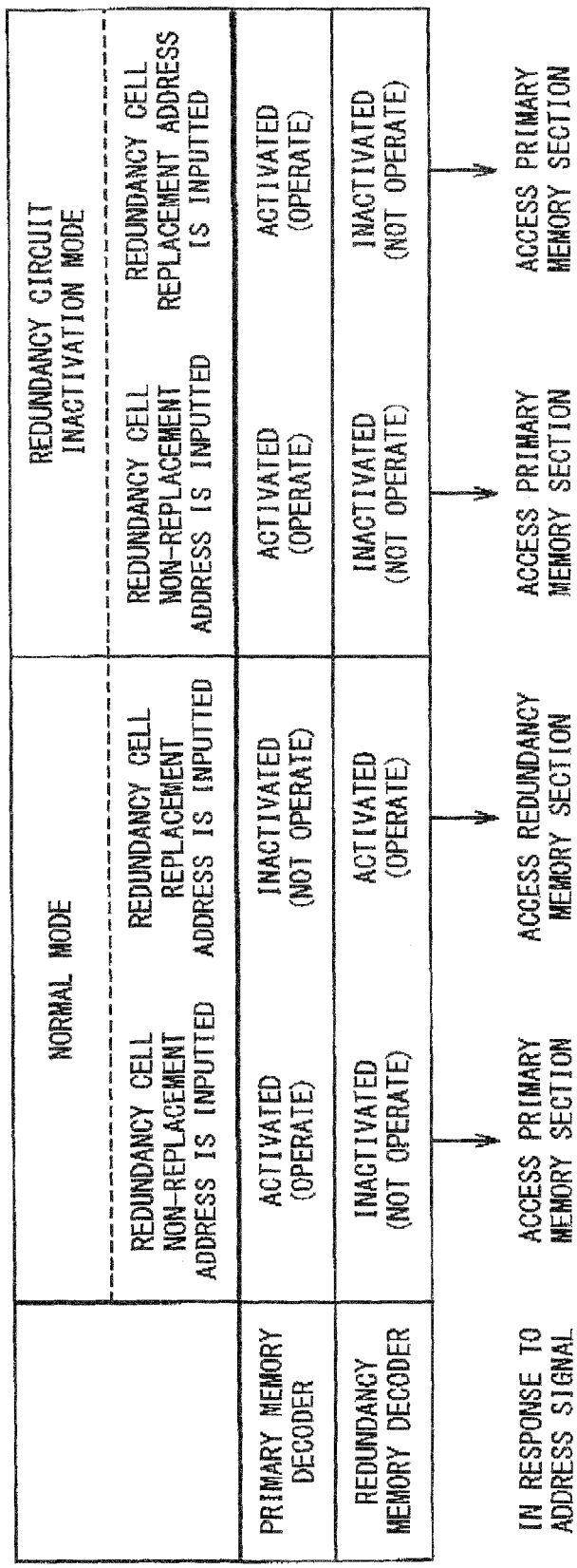
FIG. 14 is a table showing difference between accessed objects in a normal mode and a redundancy circuit inactivation mode according to an embodiment of the present invention.

FIG. 14 is a table for showing difference between access target objects after trimming in the normal mode and the redundancy circuit inactivation mode. Hereinafter, an address for selecting the memory cell required to be salvaged is referred to as a redundancy cell replacement address and the memory cell requiring no salvation is referred to as a redundancy cell non-replacement address.

Referring to FIG. 14, in the normal mode, when the redundancy cell non-replacement address is inputted, the row decoder group 11 or the column decoder group 21 is activated (operates) and the row redundancy decoder group 15 or the column redundancy decoder group 25 is inactivated (do not operate). In this case, in accordance with the input address signal, the row decoder group 11 or the column decoder group 21 gets access to the (primary) memory section 1. In the normal mode, when the redundancy cell replacement address is inputted, the row decoder group 11 or the column decoder group 21 is inactivated (do not operate) and the row redundancy decoder group 15 or the column redundancy decoder group 25 is activated (operates). In this case, in accordance with the input address signal, the row redundancy decoder group 15 or the column redundancy decoder group 25 gets access to the redundancy memory section.

In the redundancy circuit inactivation mode, when the redundancy cell non-replacement address is inputted, as in the normal mode, the row decoder group 11 or the column decoder group 21 gets access to the memory section 1 in accordance with the input address signal. On the other hand, in the redundancy circuit inactivation mode, when the redundancy cell replacement address is inputted, the row decoder group 11 or the column decoder group 21 is activated (operates) and the row redundancy decoder group 15 or the column redundancy decoder group 25 is inactivated (do not operate). In this case, in accordance with the input address signal, the row decoder group 11 or the column decoder group 21 gets access to the memory section 1.

As described above, even when the address signal for accessing the redundancy memory cell in the normal mode is inputted, in the redundancy circuit inactivation mode, not the redundancy memory cell but the memory cell is accessed. In other words, according to this embodiment, even after a defective memory cell is replaced with a redundancy memory cell by trimming, the memory cell part 1 including the defective memory cell, not the redundancy memory section, can be accessed by using the redundancy circuit inactivation mode.

[Operation for Memory Test]

Figure 5:
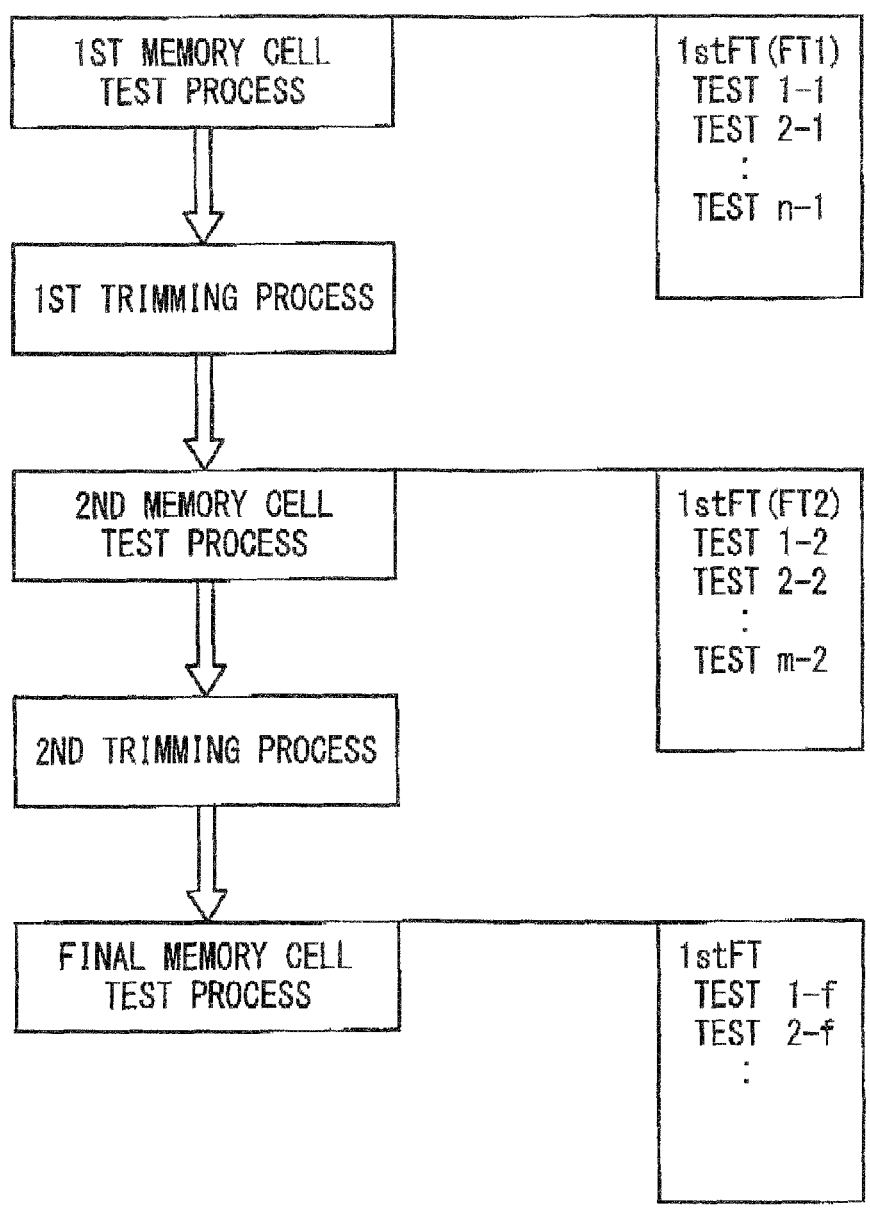
FIG. 5 is a flow chart showing an operation of a memory cell test according to a reference example.
Figure 6A:
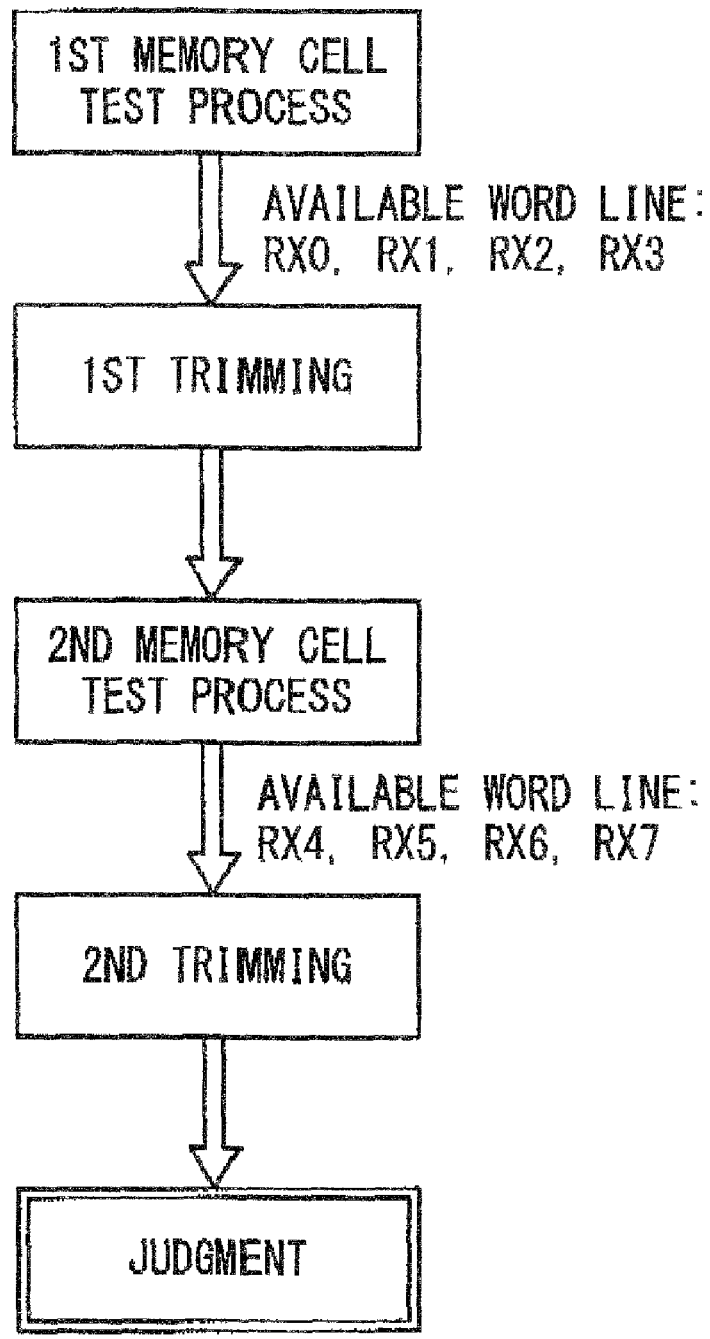
FIG. 6A is a view showing an example of the operations of the memory cell test according to a reference example.

Next, referring to FIGS. 15 to 21, operations for a memory cell test of this embodiment will be described in detail. In the memory cell test, a plurality of memory cell test processes are performed under various conditions. Here, as an example for explanation, it is assumed that two memory cell test processes (the first and the second memory cell test processes) are performed. In the following description, an example of salvation of a defective spot occurring on a word line corresponding to a row address by using a redundancy word line is illustrated. In the case of a defective spot occurring on a digit select line corresponding to a column address by using a redundancy digit select line, salvation can be achieved in a similar manner so that the explanation is omitted FIG. 15 is a flow chart showing an operation of the memory cell test of this embodiment. The memory cell test of this embodiment includes a first memory cell process (Step S1), a first trimming process (Step S2), a second memory cell test process (Step S3), a second trimming process (Step S4) and a final memory cell test process (Step S5). Comparing to the reference example shown in FIG. 5, the first memory cell test process and the final memory cell test process are similarly performed in this embodiment. However, in the second memory cell test process, an inactivation mode test (Step S32) is added to the reference example.

In the first memory cell test process, first, as in the reference example, a function test (FT1) of the semiconductor storage device 10 is performed (Step S11). Next, a plurality of tests 1-1 to S-1 (S is a natural number) are performed under predetermined conditions respectively (Step S12).

In the first memory cell test process, the function test (FT1) and the plurality of memory tests 1-1 to S-1 are performed in the normal mode for a memory space shown in FIG. 16A. Generally, the memory cell test is performed using a memory tester in accordance with a test program. In the following, a medium for performing a memory cell test is referred to as a test device. When addresses A0 to An are inputted from a test device to the semiconductor storage device 10, the word lines X0 to Xn corresponding to the addresses A0 to An are selected in the semiconductor storage device 10. Hereinafter, a word line or a redundancy word line which is used correspondingly to the addresses A0 to An is referred to as an available word line.

For example, in the first memory cell test process (Step S1), when defective memory cells (symbols X in FIG. 16B) are detected on the word lines X0 to X2, the addresses A0 to A2 are detected as defect addresses. At this time, the test device selects the redundancy word lines RX0 to RX2 as replacement objects. Here, order of priority of redundancy word lines as the replacement objects is previously determined, and in this embodiment, the redundancy word lines RX0 to RX7 are set as the replacement objects in this order.

The word lines are replaced with the redundancy word lines so as to salvage the defect addresses A0 to A2 detected in the first memory cell test process (Step S2). Here, in the first trimming process, predetermined address fuses of the address fuse circuits F0 to F10 in the row redundancy circuit section 13 are disconnected. When the address signal for selecting the defective memory cell is inputted, the row redundancy circuit section 13 inactivates the row decoder group 11 and activates the row redundancy decoder group 15.

Describing in detail, based on the result of the first memory cell test process, the address fuses of the row redundancy circuits 130 to 132 corresponding to the redundant word lines RX0 to RX2 as the replacement objects are disconnected. When the address signal 101 for selecting any of the addresses A0 to A2 is inputted, the row redundancy circuit group 13 in which the address fuses are disconnected, inactivates the row predecoder group 12 and the row decoder group 11 and outputs the row redundancy selection signal 103 for selecting corresponding one of the redundancy word lines RX0 to RX2. Thereby, as shown in FIG. 16C, the word lines X0 to X2 corresponding to the addresses A0 to A2 are replaced with the redundancy word lines RX0 to RX2 to salvage the defect addresses.

After the first trimming process, the second memory cell test process including a plurality of memory cell tests is performed under conditions different to the first memory cell test process (Step S3). As shown in FIG. 16C, in the second memory cell test process, a plurality of memory cell tests are performed to the memory space in which the word lines X0 to X2 are replaced with the redundancy word lines RX0 to RX2.

In the second memory cell test process, first, as in the aforementioned reference example, a function test (FT2) is performed under different conditions from those in the first memory cell test process (Step S31). In the function test (FT2), there are three cases: no defect address is detected (FIG. 17A); a defect address is detected at any of the addresses A0 to A2 (FIG. 17B); and a defect address is detected at any of the addresses A3 to An (FIG. 17C).

After the function test (FT2) using the test device of this embodiment, the inactivation mode test is performed (Step S32). In the inactivation mode test, the salvaged address and the used redundancy circuit (here, the row redundancy circuit) for salvation in the first trimming process can be checked by switching between the normal mode and the inactivation mode to write and read information by the added enable control circuit 40 of this embodiment.

Referring to FIGS. 18 to 20, operation of the inactivation mode test of this embodiment will be described in detail. In the following description, an operation of the inactivation mode test will be explained using a case where the addresses A0 to A2 are salvaged by the redundancy word lines RX0 to RX2 in the first trimming process and the address A3 is detected as a defect address in the function test (FT2) as an example (FIG. 17C).

FIG. 18 is a flow chart of the inactivation mode test. When the inactivation mode test is started by the test device, the semiconductor storage device 10 is set to the normal mode. In this state, "0" is written to all addresses in the memory space (Step S321, FIG. 19A). When the semiconductor storage device 10 is set to the normal mode, the available word lines corresponding to the addresses A0 to A2 become the redundancy word lines RX0 to RX2 and the data "0" written to the addresses A0 to A2 is recorded into the redundancy memory cells on the redundancy word lines RX0 to RX2. The data "0" written to the other addresses A3 to An is recorded into the memory cells on the word lines X3 to Xn. However, there is a case where the data "0" is not written into the memory cell (redundancy memory cell) detected as defective in the function test (FT2).

Next, the semiconductor storage device 10 is set to the redundancy circuit inactivation mode. In this state, information "1" which is different from the information written at Step S321 is written to all addresses in the memory space (Step S322, FIG. 19B). When semiconductor storage device 10 is set to the redundancy circuit inactivation mode, the redundancy word lines RX0 to RX2 are not used as the available word lines and the word lines X0 to Xn are available for all addresses A0 to An in the memory space. Thus, the data "1" written to the addresses A0 to An is recorded into the memory cells on the word lines X0 to Xn. However, there is a case where the data "1" is not written into the memory cell (redundancy memory cell) detected as defective in the function test (FT2).

Subsequently, the semiconductor storage device 10 is set to the normal mode again. In this state, information is read from all addresses in the memory space (Step S323, FIG. 19C). In the normal mode, the redundancy word lines RX0 to RX2 in place of the word lines X0 to X2 are used as the available word lines corresponding to the addresses A0 to A2 and the data "0" written into the redundancy memory cells on the redundancy word lines RX0 to RX2 are read from the addresses A0 to A2. From the other addresses A3 to An, the data "1" written into the memory cells on the word lines X3 to Xn is read.

A row address from which the data "0" is read and a row address including an area at which error occurs at reading or writing of data at Step S323 are all detected as defect addresses (Step S324). Here, when no defect address is detected, it is judged that no defect is detected in the first memory cell test process and the function test (FT2), and the inactivation mode test is finished (Step S324No).

When the defect address is detected at Step S324, it is checked whether a row address on which all column addresses are defective exists or not (Step S325). Here, when the row address on which all column addresses are defective (referred to as all-defect row address) exists, it is checked whether there is an all-defect row address which matches the defect address detected in the function test (FT2) or not (Step S326). In this example, as shown in FIG. 19C, among the all-defect row addresses (the addresses A0 to A2), no address which matches the defect address (the address A3) detected in the function test (FT2) exists. In this case, the all-defect row addresses (the addresses A0 to A2) are determined as addresses replaced in the first trimming process by the test device. The number of the row addresses (addresses A0 to A2) is identified by the test device as the number of redundancy word lines as the replacement objects in the first trimming process (the number of salvaged addresses: hereinafter referred to as a replacement object number ROW1) (Step S326No, and S327).

A row address on which not all but a part of the column addresses is defective (the address A3, referred to as partial defect row address) is set as a salvaging object address in the second trimming process by the test device. The number of the partial defect row address is added to the number of the redundant word objects as the replacement objects in the second trimming process (the number of salvaging object addresses; hereinafter referred to as a replacement object number ROW2) (Step S328).

On the other hand, when no all-defect row address is detected at Step S325, the defect address detected at Step S324 is judged as a defect address newly detected in the function test (FT2). In this case, it can be recognized that no defect is detected in the first memory cell test process. That is, the number of redundancy word lines which can serve as the replacement objects in the second trimming process is equal to the number of all prepared redundancy word lines (hereinafter referred to as a replaceable available number ROW). Here, the defect address detected by the test device is set to the salvaging object address in the second trimming process. The number of the defect addresses is added to the replacement object number ROW2 (Step S324NO, S325No, and S329).

When an address which matches the defect address detected in the function test (FT2) is included in the all-defect row addresses, the semiconductor storage device 10 is judged to be defective (FAIL) as a defective product and the memory cell test is finished (Step S326Yes, S330). For example, as shown in FIG. 17B, when the address A0 is detected as the defect address in the function test (FT), the defect address detected in the function test (FT2) (the address A0) is included in the all-defect row addresses (the addresses A0 to A2). In such case, it can be recognized that a defect exists in the redundancy word line RX0 which is used for replacement in the first trimming process.

As described above, in the inactivation mode test, the defect address salvaged in the first trimming process can be identified. Furthermore, the number of the redundancy word lines which are used for replacement in the first trimming process (the replacement object number ROW1) can also be identified. Here, since the order of priority of the replacement redundancy word lines is previously set, the redundancy word lines as the replacement objects in the first trimming process (used row redundancy circuits) can be identified based on the identified replacement object number ROW1. In the above-mentioned example, the addresses A0 to A2 are identified as the defect addresses salvaged in the first trimming process, and the redundancy word lines RX0 to RX2 are identified as the redundancy word lines used as the replacement objects in the first trimming process. Note that the identified replacement object number ROW1 is 3 and the identified replacement object number ROW2 is 1.

After the inactivation mode test, a plurality of memory cell tests 1-2 to t-2 (t is a natural number) are performed under different conditions from those in the first memory cell test process (Step S33). When a new defect address is detected in the memory cell tests 1-2 to t-2, the number of the detected defect addresses is added to the replacement object number ROW2 identified in the inactivation mode test. For example, as shown in FIG. 20A, when four addresses A4 to A7 are newly detected as defect addresses in the tests 1-2 to t-2, 4 is added to the replacement object number ROW2=1 identified in the inactivation mode test and thus, the replacement object number ROW2 becomes 5. At this time, when the new defect addresses are the same as the replacement object addresses in the first trimming process identified in the inactivation mode test (here, the addresses A0 to A2), the semiconductor storage device 10 is determined to be defective (FAIL). When the sum of the replacement object number ROW1 and the replacement object number ROW2 exceeds the replacement available number ROW, the semiconductor storage device 10 is determined to be defective (FAIL). In the example shown in FIG. 20A, the replacement object number ROW1 is 3 and the replacement object number ROW2 is 5, Since the sum 8 is same to the replacement available number ROW in this example, the defective memory cells can be replaced.

When the second memory cell test process is finished and a defect address is detected in the second memory cell test process, the defect address is salvaged in the second trimming process (Step S4). In the second trimming process, a predetermined address fuse in the row redundancy circuit section 13 is disconnected so that the word line corresponding to the newly detected defect address may be replaced with the redundancy word line which is not replaced in the first trimming process for replacement. Here, the row redundancy circuit whose address fuse is to be disconnected is the row redundancy circuit corresponding to the redundancy word line selected as the replacement object in the second memory cell test process. In this example, referring to FIG. 20B, the defect addresses (the addresses A3 to A7) newly detected in the second memory cell test process are replaced with unused redundancy word lines RX3 to RX7.

As described above, the memory cell test in this embodiment can identify the redundancy circuit used for salvaging the defective memory cell in the first trimming process in accordance with the inactivation mode test and check the redundancy circuits which are available in the second trimming process. Thus, a plurality of memory cell processes under different test conditions can be performed and the defective memory cell detected in each process can be salvaged.

Figure 21A:
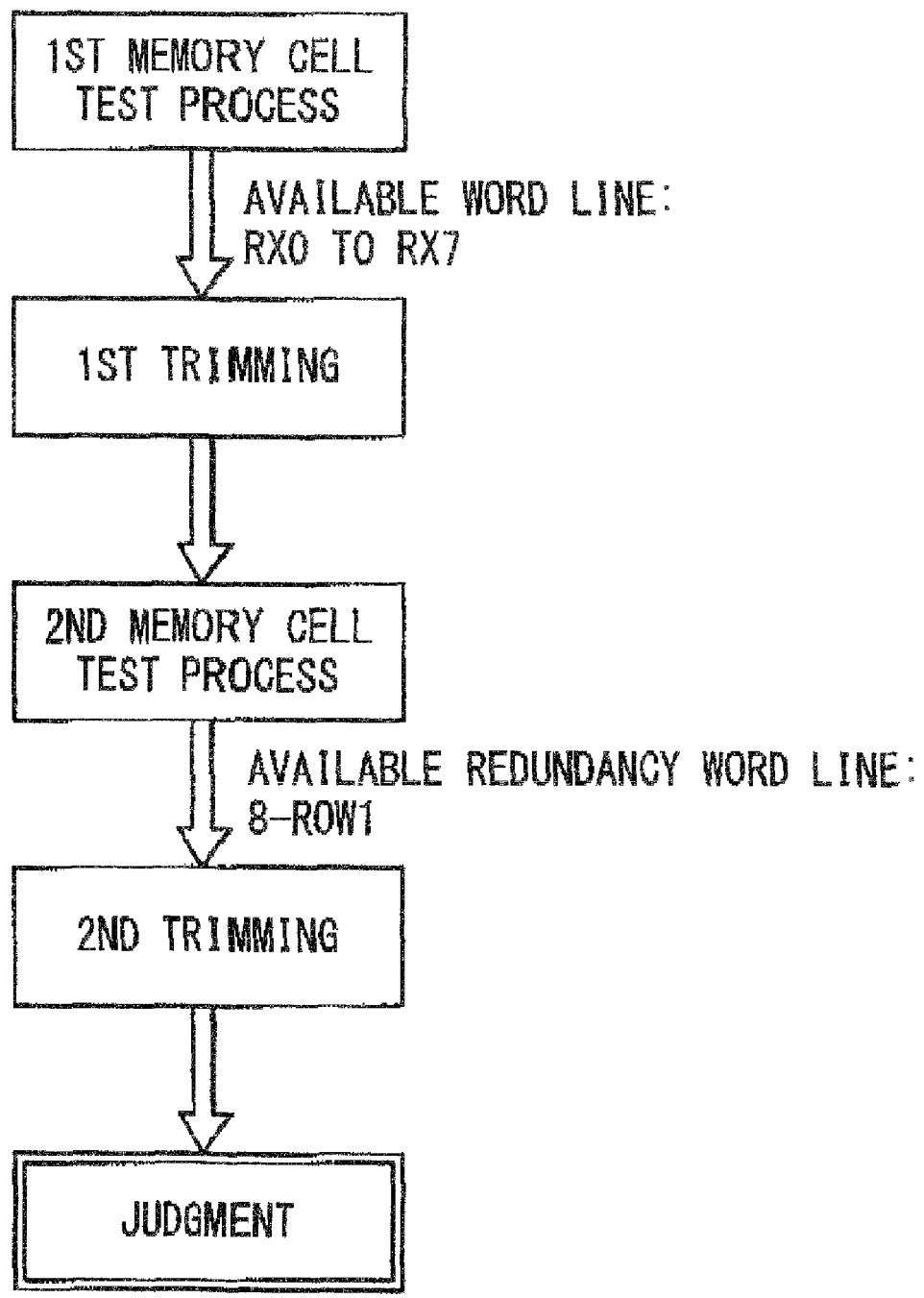
FIGS. 21A and 21B are views showing an example of operations of a memory cell test according to an embodiment of the present invention.
Figure 21B:
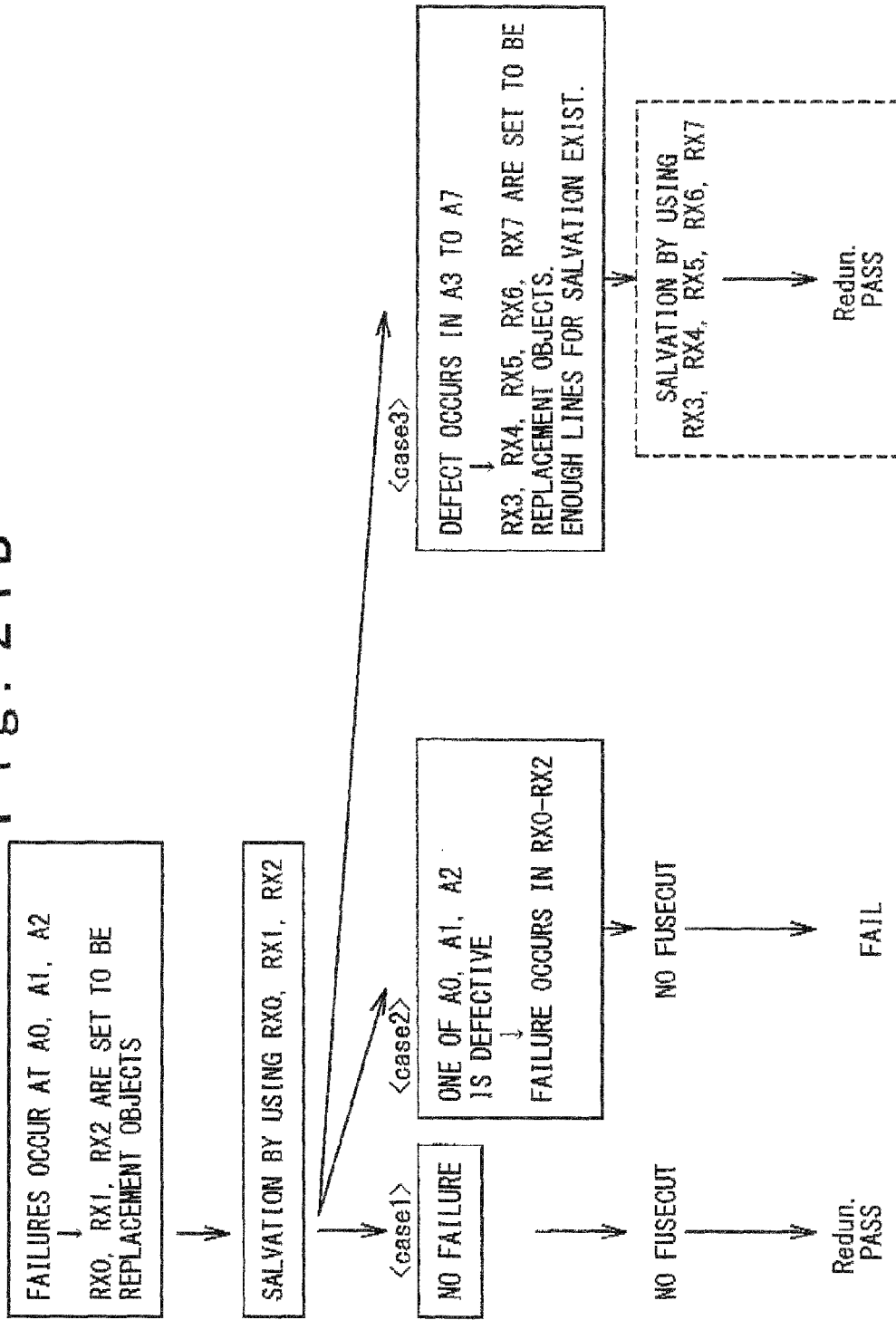

As described above, when a defect address (for example, A0 to A2) is detected in the first memory cell test process, an operation from the second memory cell test process to the final judgment of the device are classified into three cases shown in FIG. 21B (case 1 to case 3) depending on the defect spots detected in the second memory cell test process. Here, the defect addresses are assumed to be salvaged by the redundancy word lines.

Case 1: when no defect spot is detected in the second memory cell test process, disconnection processing of the fuse is not performed in the second trimming process (Step S4). In this case, the semiconductor storage device 10 is determined to be non-defective (PASS) (to be exact, it is expected to be determined as a non-defective device). The memory space determined to be non-defective is a memory space in which the word lines X0 to X2 shown in FIG. 16C are replaced with the redundancy word lines RX0 to RX2.

Case 2: when a defect spot is detected in any of the addresses A0 to A2 in the second memory cell test process, it is determined that the defect spot occurs in the redundancy word lines RX0 to RX2 used for replacement in the first trimming process. In this case, no fuse is disconnected in the second trimming process and the device is determined to be defective (FAIL).

Case 3: when an address which is different from the defect address detected in the first memory cell test process is determined to be defective in the second memory cell test process, the defect address is salvaged by the redundancy word line selected from available redundancy word lines. Thereby, the device is judged to be non-defective (PASS) (to be exact, it is expected to be a non-defective device). In the case 3, when the number of the addresses determined to be defective in the second memory cell test process (the number of the row addresses) is the number of available redundancy word lines (ROW-ROW1) or less, the defect spots can be salvaged. For example, when defect spots are detected at five addresses A3 to A7, the redundancy word lines RX3 to RX7 are selected as replacement objects. The address fuses are disconnected so as to select the redundancy word lines RX3 to RX7 in place of the word lines X3 to X7 in the second trimming process and the device is judged to be non-defective (PASS) (to toe exact, it is expected to be a non-defective device).

As described above, when the number of defect addresses detected in the second memory cell test process (Step S3) is ROW-ROW1 or less, the defect addresses can be salvaged in the second trimming process. For example, in the case where the number of prepared redundancy word lines is 8 (ROW=8) and the number of redundancy word lines used for replacement in the first trimming process is 3 (ROW1=3), five defect addresses at the maximum can be salvaged in the second trimming process.

In the aforementioned reference example, since the number of addresses which can be salvaged is set for each memory cell test process, even if an unused redundancy word line exists, the device is determined to be defective (FAIL) when the number of defect address detected in a certain test stage reaches the predetermined number. However, according to this embodiment, the number of addresses which can be salvaged need not be set for each memory cell test process. As a result, as long as the number of defect addresses detected in the whole memory cell test process falls within the number of prepared redundancy word lines (ROW), the defect addresses can be salvaged irrespectively of the number of defect addresses detected in each memory cell process.

According to this embodiment, by switching between the redundancy circuit inactivation mode and the normal mode in performing the second memory cell test process, all column addresses on a row address or all row addresses on a column address can be made defective. Thereby, it is possible to identify the redundancy circuits used for salvation in the first trimming process and the redundancy circuits which are available for salvation of the memory cell in the second trimming process. For this reason, the memory cell test process can be performed under different conditions (different temperatures or the like) and defects under different conditions can be salvaged. That is, assume that "trimming based on fuse connection/disconnection information which is a result of memory cell test" is one process stage, a plurality of process stages can be carried out.

According to the reference example, a roll call test is required to identify the redundancy memory cell which may serve as a replacement object in the second and subsequent processes, and information of the enable fuse and the address fuse must be obtained. However, according to this embodiment, the roll call test is not required. Furthermore, by merely performing a memory test in which test pattern for writing and reading of data is appropriately devised, redundancy memory cells which can serve as replacement objects in the second and subsequent processes can be identified. For this reason, it is expected that the time for identifying available redundancy memory cell group in the next trimming is reduced as compared to the reference example.

According to this embodiment, enable control circuit 40 including at least one transistor can switch between the normal mode and the redundancy circuit inactivation mode in accordance with an external signal. Furthermore, by utilizing this mode switching to perform a memory cell test, the salvaged defect address and the redundancy circuit used for salvation can be identified for each memory cell test process. According to this embodiment, by adding the enable control circuit 40 of small area and devising the effective method for memory test, a plurality of memory cell processes can be performed without fixing the replacement object number for each memory cell test process.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor storage device, comprising:
    a memory section including a plurality of memory cell groups;
    a redundancy memory section including a plurality of redundancy memory cell groups;
    a redundancy circuit section configured to stop an access to the memory section when the redundancy circuit section is activated, and to activate one of the plurality of redundancy memory cell groups corresponding to an address signal when the redundancy circuit section is activated and receives the address signal;
    a redundancy circuit control section external from the redundancy circuit section and configured to produce a redundancy circuit inactivation signal to the redundancy circuit section;
    a redundancy decoder configured to access one of the plurality of redundancy memory cell groups corresponding to a selection signal in response to the selection signal outputted from the redundancy circuit section; and
    a decoder configured to access one of the plurality of memory cell groups corresponding to the address signal in response to an input of the address signal, and to stop an access to the plurality of memory cell groups in the memory section in response to the selection signal,
    wherein the redundancy circuit section has a normal mode in which an access to the redundancy memory section is permitted and a redundancy circuit inactivation mode in which an access to the redundancy memory section is prohibited, and the normal mode and the redundancy circuit inactivation mode are changed to each other in response to a first signal.

2. The semiconductor storage device according to claim 1, wherein the redundancy circuit section comprises a plurality of redundancy circuits respectively corresponding to the plurality of memory cell groups, and each of the plurality of redundancy circuits comprises:
    a first fuse circuit configured to determine whether corresponding one of the plurality of redundancy memory cell groups is activated or not in response to a second signal and connection/disconnection state of a fuse incorporated in the first fuse circuit;
    a second fuse circuit configured to determine whether the corresponding one of the plurality of redundancy memory cell group is activated or not in response to the second signal, the address signal and connection/disconnection state of a fuse incorporated in the second fuse circuit; and
    an enable control circuit configured to determine whether the corresponding one of the plurality of redundancy memory cell groups is activated or not in response to the first signal.

3. The semiconductor storage device according to claim 2, wherein each of the plurality of redundancy circuits comprises:
    a logic circuit configured to input a plurality of input signals to perform a logic calculation and output a result of the logic calculation as the selection signal;
    a first switch circuit connected to the first fuse circuit; and
    a second switch circuit connected to the second fuse circuit,
    wherein the first fuse circuit is configured to output a third signal in response to the second signal,
    the second fuse circuit is configured to output a fourth signal in response to the second signal and the address signal,
    a switching operation of the first switch circuit is controlled by the third signal to determine a signal level of any of the plurality of input signals,
    a switching operation of the second switch circuit is controlled by the fourth signal to determine a signal level of any of the plurality of input signals, and the enable control circuit determines a signal level of any of the plurality of input signal in response to the first signal independently on switching operations of the first and second switch circuits.

4. The semiconductor storage device according to claim 3, wherein the first switch circuit comprises a first transistor having:
    a gate connected to the first fuse circuit; a drain connected to a first power source and an input of the logic circuit; and
    a source connected to a second power source,
    the second switch circuit comprises a second transistor having:
    a gate connected to the second fuse circuit;
    a drain connected to the first power source and an input of the logic circuit; and
    a source connected to the second power source,
    the enable control circuit comprises a third transistor having:
    a gate to which the first signal is inputted;
    a drain connected to the first power source and an input of the logic circuit; and
    a source connected to the second power source, and
    the source and the drain of the third transistor and the source and the drain of the second transistor are connected to each other in parallel.

* * * * *